United States Patent
Kawai

(10) Patent No.: US 7,953,129 B2
(45) Date of Patent: May 31, 2011

(54) LASER LIGHT SOURCE DEVICE, EXPOSURE DEVICE, AND MASK INSPECTION DEVICE USING THIS LASER LIGHT SOURCE DEVICE

(75) Inventor: Hitoshi Kawai, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/630,590

(22) Filed: Dec. 3, 2009

(65) Prior Publication Data
US 2010/0073658 A1    Mar. 25, 2010

Related U.S. Application Data

(60) Division of application No. 11/514,256, filed on Sep. 1, 2006, now Pat. No. 7,653,096, which is a continuation of application No. PCT/JP2005/004381, filed on Mar. 7, 2005.

(30) Foreign Application Priority Data

Mar. 8, 2004   (JP) ................................. 2004-063679

(51) Int. Cl.
*H01S 3/10* (2006.01)
(52) U.S. Cl. ......................................... 372/22; 359/134
(58) Field of Classification Search .................... 372/22, 372/21, 75; 356/67
See application file for complete search history.

(56) References Cited

U.S. PATENT DOCUMENTS

| | | | |
|---|---|---|---|
| 4,866,720 A | 9/1989 | Holly | |
| 5,144,630 A | 9/1992 | Lin | |
| 5,742,416 A | 4/1998 | Mizrahi | |
| 5,832,009 A * | 11/1998 | Kikuchi | 372/21 |
| 5,991,316 A * | 11/1999 | Kikuchi | 372/21 |
| 6,549,311 B1 | 4/2003 | Hakki et al. | |
| 6,559,986 B1 | 5/2003 | Sauer et al. | |

FOREIGN PATENT DOCUMENTS

| | | |
|---|---|---|
| JP | 09-121069 | 5/1997 |
| JP | 2000-200747 | 7/2000 |
| JP | 2002-258339 | 9/2002 |

* cited by examiner

*Primary Examiner* — Minsun Harvey
*Assistant Examiner* — Tuan N. Nguyen
(74) *Attorney, Agent, or Firm* — Morgan, Lewis & Bockius LLP

(57) ABSTRACT

A laser light source device 1, comprising M number of laser light sources, of which frequency is shifted from a fundamental frequency by $(m-1)\cdot a\cdot\Delta\omega$, a first laser light source section 2 and a first fiber amplifier section 4 for amplifying these laser lights, a first optical multiplexer 6 for approximately coaxially superimposing the laser lights emitted from the first fiber amplifier section 4 and emitting the laser lights, a first wavelength conversion device 9 for multiplying the frequency of the laser lights emitted from the first optical multiplexer 6 by A, M number of laser light sources, of which frequency is shifted from the fundamental frequency by $(m-1)\cdot b\cdot\Delta\omega$, a second laser light source section 3 and a second fiber amplifier section 5 for amplifying these laser lights, a second optical multiplexer 7 for approximately coaxially superimposing the laser lights emitted from the second fiber amplifier section 5 and emitting the laser lights, a second wavelength conversion device 10 for multiplying the frequency of the laser lights emitted from the second optical multiplexer 7 by B, and a third wavelength conversion device 11 for simultaneously receiving the laser lights emitted from the first and second wavelength conversion devices 9 and 10 and converting the laser lights into laser lights, of which frequency is (A+B) times the fundamental frequency, the laser light source device 1 being characterized in that the expression $A\cdot a+B\cdot b=0$ is satisfied.

14 Claims, 9 Drawing Sheets

LASER LIGHT SOURCE DEVICE, EXPOSURE DEVICE, AND MASK INSPECTION DEVICE USING THIS LASER LIGHT SOURCE DEVICE

This application is a Divisional of U.S. patent application Ser. No. 11/514,256 filed Sep. 1, 2006 now U.S. Pat. No. 7,653,096, which is a continuation of PCT/JP2005/004381 filed on Mar. 7, 2005, and claims the benefit of Japanese Patent Application No. 2004-063679, filed Mar. 8, 2004, all of which are hereby incorporated by reference in their entirety.

FIELD OF THE INVENTION

The present invention relates to a laser light source device mainly for generating high power light with 193 nm wavelengths, and an exposure device and a mask inspection device using this laser light source device.

BACKGROUND OF THE INVENTION

As the density of semiconductor devices become higher and line widths thereof become finer, the wavelengths of lights used for exposure devices and mask inspection devices also become shorter every year, and an exposure device and mask inspection device having a light source with a 193 nm wavelength light are at the stage of practical use. For example, a solid-state laser (laser light source device) which generates light with a 193 nm wavelength is constructed such that the light of a semiconductor laser with a 1547 nm wavelength is used as a fundamental wave, and is branched into a plurality of laser lights by an optical branching means, and a plurality of these laser lights are amplified in parallel by a fiber amplifier, and the emitting ends (fibers) thereof are bundled and entered into a wavelength conversion optical system, and by this wavelength conversion optical system, the wavelength of the fundamental wave is converted into eighth-harmonic waves, and a 193 nm of high power light is acquired (for example, Japanese Patent Application Laid-Open No. 2000-200747 (pages 18 to 25, see FIG. 11). Therefore when such a laser beam is used for an exposure device and mask inspection device, it is very important to improve conversion efficiency in wavelength conversion, including the wavelength conversion optical system.

However, with the above method in which fibers are spatially bundled, it is difficult to condense all light to one point on the wavelength conversion crystal for wavelength conversion, and to satisfy the acceptance angle of this wavelength conversion crystal, therefore high conversion efficiency cannot be implemented. It is possible to construct to form an image on the wavelength conversion optical system for each of the bundled fibers using a micro-lens array, but it is difficult to implement the necessary processing and adjustment accuracy to acquire high conversion efficiency.

SUMMARY OF THE INVENTION

With the foregoing in view, it is an object of the present invention to provide a laser light source device that can implement high power laser lights with a short wavelength with improved wavelength conversion efficiency, by emitting laser lights of which frequencies are slightly shifted into an optical multiplexer, and approximately coaxially superimposing them, and to provide an exposure device and a mask inspection device using this laser light source device.

To achieve the above object, a laser light source device according to a first aspect of the present invention comprises: a first laser light source section comprising M number of laser light sources, where the m-th laser light source emits a laser light having the frequency shifted from a first fundamental frequency by $a_m \cdot \Delta\omega$ (m=1, 2, . . . , M); a second laser light source section comprising M number of laser light sources, where the m-th laser light source emits a laser light having the frequency shifted from a second fundamental frequency by $b_m \cdot \Delta\omega$ (m=1,2, . . . , M); a first optical multiplexer for emitting a first fundamental wave by approximately coaxially superimposing M number of laser lights emitted from the first laser light source section; a second optical multiplexer for emitting a second fundamental wave by approximately coaxially superimposing M number of laser lights emitted from the second laser light source section; and a wavelength conversion optical system, comprising a first wavelength conversion device for generating an A-harmonic wave, of which frequency corresponds to A times of the first fundamental wave, a second waveform conversion device for generating a B-harmonic wave, of which frequency corresponds to B times of the second fundamental wave, and a third wavelength conversion device for receiving light of the A-harmonic wave and B-harmonic wave, and generating a sum frequency thereof by sum frequency generation, and is characterized in that the expression $A \cdot a_m + B \cdot b_m = 0$ ($a_1, a_2, \ldots a_m$ and $b_1, b_2, \ldots b_m$ are arbitrary numbers that satisfy the expression) is satisfied.

It is preferable that this configuration further comprises a first light amplifier section having M number of light amplifiers each of which amplifies each laser light generated from M number of laser light sources in the first laser light source section, and a second light amplifier section having M number of light amplifiers each of which amplifies each laser light generated from M number of laser light sources in the second laser light source section.

Also in the above configuration, it is preferable that the first optical multiplexer or the second optical multiplexer comprises a diffraction grating or dispersion prism for receiving the laser light emitted from the first laser light source section or the second laser light source section at an incident angle which is set according to the shift amount from the fundamental frequency, and approximately coaxially superimposing the laser lights, which are diffracted or refracted and emitting the laser lights.

A laser light source device according to the second aspect of the present invention comprises: a first laser light source section comprising M number of laser light sources, where the m-th laser light source emits a laser light having the frequency shifted from a first fundamental frequency by $a_m \cdot \Delta\omega$ (m=1, 2, . . . , M); a second laser light source section comprising M number of laser light sources, where the m-th laser light source emits a laser light having the frequency shifted from a second fundamental frequency by $b_m \cdot \Delta\omega$ (m=1, 2, . . . , M); a first optical multiplexer for emitting a first fundamental wave by approximately coaxially superimposing M number of laser lights emitted from the first laser light source section; a second optical multiplexer for emitting a second fundamental wave by approximately coaxially superimposing M number of laser lights emitted from the second laser light source section; and a wavelength conversion optical system, comprising a wavelength conversion device for generating a sum frequency of the first fundamental wave and second fundamental wave by sum frequency generation, and is characterized in that expression $a_m + b_m = 0$ ($a_1, a_2, \ldots a_m$ and $b_1, b_2, \ldots b_M$ are arbitrary numbers that satisfy the expression) is satisfied.

A laser light source device according to a third aspect of the present invention comprises: a first laser light source section comprising M number of laser light sources, where the m-th laser light source emits a laser light having the frequency shifted from a fundamental frequency by $a_m \cdot \Delta\omega$ (m=1, 2, ... , M); a second laser light source section comprising M number of laser light sources, where the m-th laser light source emits a laser light having the frequency shifted from the fundamental frequency by $b_m \cdot \Delta\omega$ (m=1, 2, ..., M); a first optical multiplexer for emitting a first fundamental wave by approximately coaxially superimposing M number of laser lights emitted from the first laser light source section; a second optical multiplexer for emitting a second fundamental wave by approximately coaxially superimposing M number of laser lights emitted from the second laser light source section; and a wavelength conversion optical system, comprising a first wavelength conversion device for generating a third-harmonic wave, of which frequency corresponds to triple the first fundamental wave, a second wavelength conversion device for generating a fourth-harmonic wave, of which frequency corresponds to four times the second fundamental wave, and a third wavelength conversion device for receiving the third-harmonic wave and fourth-harmonic wave, and generating a seventh-harmonic wave of which frequency is seven times the fundamental frequency by sum frequency generation, and is characterized in that expression $3 \cdot a_m + 4 \cdot b_m = 0$ ($a_1, a_2, \ldots a_m$ and $b_1, b_2, \ldots b_M$ are arbitrary numbers that satisfy the expression) is satisfied.

It is preferable that this laser light source device further comprises a third laser light source section for emitting laser light having the fundamental frequency, and a fourth wavelength conversion device for receiving the seventh-harmonic wave and the laser light emitted from the third light source, and generating an eighth-harmonic wave of which frequency is eight times the fundamental wave by sum frequency generation.

A laser light source device according to a fourth aspect of the present invention comprises: a first laser light source section comprising M number of laser light sources, where the m-th laser light source emits a laser light having the frequency shifted from a fundamental frequency by $a_m \cdot \Delta\omega$ (m=1, 2, ..., M); a second laser light source section comprising M number of laser light sources, where the m-th laser light source emits a laser light having the frequency shifted from the fundamental frequency by $b_m \cdot \Delta\omega$ (m=1, 2, ..., M); a first optical multiplexer for emitting a first fundamental wave by approximately coaxially superimposing M number of laser lights emitted from the first laser light source section; a second optical multiplexer for emitting a second fundamental wave by approximately coaxially superimposing M number of laser lights emitted from the second laser light source section; and a wavelength conversion optical system comprising a first wavelength conversion device for generating a third-harmonic wave, of which frequency corresponds to triple the first fundamental wave, a second wavelength conversion device for generating a fourth-harmonic wave, of which frequency corresponds to four times the second fundamental wave, a third wavelength conversion device for receiving the third-harmonic wave and fourth-harmonic wave, and generating a seventh-harmonic wave, of which frequency is shifted from the frequency that is seven times the fundamental frequency by $b_m \cdot \Delta\omega$ (m=1, 2, ..., M) by sum frequency generation, and a fourth wavelength conversion device for receiving a part of the second fundamental wave and the seventh-harmonic wave, and generating an eighth-harmonic wave, of which frequency is eight times the fundamental frequency, by sum frequency generation, and is characterized in that expression $3 \cdot am + 5 \cdot b_m = 0$ ($a_1, a_2, \ldots a_m$ and $b_1, b_2, \ldots b_m$ are arbitrary numbers that satisfy the expression) is satisfied.

A laser light source device according to a fifth aspect of the present invention, comprises: a first laser light source section comprising M number of laser light sources, where the m-th laser light source emits a laser light having the frequency shifted from a fundamental frequency by $a_m \cdot \Delta\omega$ (m=1, 2, ... , M); a second laser light source section comprising M number of laser light sources, where the m-th laser light source emits a laser light having the frequency shifted from the fundamental frequency by $b_m \cdot \Delta\omega$ (m=1, 2, ..., M); a first optical multiplexer for emitting a first fundamental wave by approximately coaxially superimposing M number of laser lights emitted from the first laser light source section; a second optical multiplexer for emitting a second fundamental wave by approximately coaxially superimposing M number of laser lights emitted from the second laser light source section; and a wavelength conversion optical system comprising a first wavelength conversion device for generating a second-harmonic wave, which frequency corresponds to double the first fundamental wave, a second wavelength conversion device for generating a fifth-harmonic wave, of which frequency corresponds to five times the second fundamental wave, a third wavelength conversion device for receiving the second-harmonic wave and fifth-harmonic wave, and generating a seventh-harmonic wave of which frequency is seven times the fundamental frequency by sum frequency generation, and a four wavelength conversion device for receiving the seventh-harmonic wave and the first fundamental wave transmitted through the first wavelength conversion device and the third wavelength conversion device, and generating an eighth-harmonic wave of which frequency is eight times the fundamental frequency by sum frequency generation, and is characterized in that the expression $3 \cdot a_m + 5 \cdot b_m = 0$ ($a_1, a_2, \ldots a_m$ and $b_1, b_2, \ldots, b_m$ are arbitrary numbers that satisfy the expression) is satisfied.

A laser light source device according to a sixth aspect of the present invention, comprises: a plurality of optical devices for coaxially superimposing a plurality of laser lights of which frequencies are shifted from each other, and emitting as one laser beam; and a wavelength conversion device for generating a sum frequency once or more times for the laser beams emitted from the plurality of optical devices to cancel the mutual frequency shift, and performing wavelength conversion for the laser beams.

It is preferable that this optical device comprises a plurality of light amplifiers for amplifying each of the plurality of laser lights.

It is also preferable that the means of coaxially superimposing the plurality of laser lights and emitting as one laser beam is a diffraction grating or a dispersion prism.

An exposure device according to the present invention, comprises: the laser light source device according to the sixth aspect of the present invention; an illumination optical system for irradiating laser lights emitted from the laser light source device on a reticle; and a projection optical system for condensing the laser lights transmitted through the reticle on a semiconductor wafer, and forming an image of the reticle.

A mask inspection device according to the present invention, comprises: the laser light source device according to the sixth aspect of the present invention; a phase conversion device for converting a phase of the laser light emitted from the laser light source device; an illumination optical system for condensing the laser lights of which phases are converted by the phase conversion device and irradiating the condensed lights on a mask; an image formation optical system for condensing the laser lights transmitted through the mask; and a sensor for detecting the laser light of which image is formed by the image formation optical system.

By constructing the laser light source device according to the present invention as above, the wavelengths of the laser lights emitted from the laser light source are efficiently converted, so high power lights with short wavelength can be acquired. Also by constructing an exposure device and a mask inspection device using the wavelength conversion optical system according to the present invention, a semiconductor device with a high degree of integration can be implemented.

DESCRIPTION OF THE PREFERRED EMBODIMENTS

Figure 1:
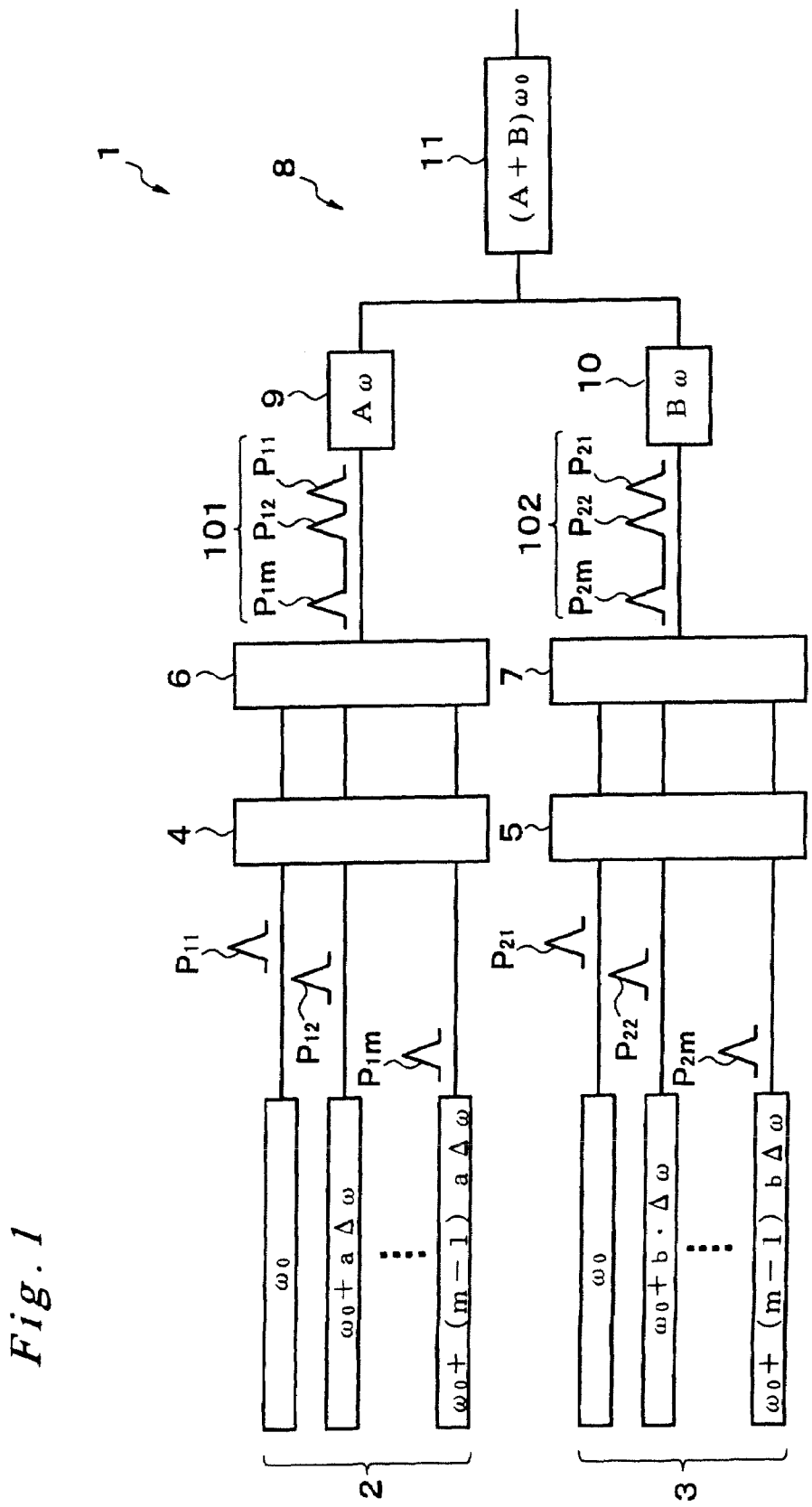
FIG. 1 is a block diagram depicting the basic configuration of the laser light source device according to the present invention.

Preferred embodiments of the present invention will now be described with reference to the drawings. First the basic configuration of the laser light source device will be described using FIG. 1. The laser light source device 1 comprises a first laser light source section 2, second laser light source section 3, first fiber amplifier section 4, second fiber amplifier section 5, first optical multiplexer 6, second optical multiplexer 7, and wavelength conversion optical system 8.

The first laser light source section 2 has M number of laser light sources, and the m-th laser light source emits laser light having the frequency shifted from a fundamental frequency by $(m-1) \cdot a \cdot \Delta\omega$ (m=1, 2, ..., M). The second laser light source section 3 has M number of laser light sources, and the m-th laser light source emits laser light having the frequency shifted from the fundamental frequency by $(m-1) \cdot b \cdot \Delta\omega$ (m=1, 2, ..., M). The frequencies $\omega_{1m}$ and $\omega_{2m}$ of the laser lights which are emitted from the first laser light source section 2 and the second laser light source section 3 respectively are given by the following Expressions (1) and (2).

$$\omega_{1m} = \omega_0 + (m-1) \cdot a \cdot \Delta\omega \quad (1)$$

$$\omega_{2m} = \omega_0 + (m-1) \cdot b \cdot \Delta\omega \quad (2)$$

where m=1, 2, ..., M

The first fiber amplifier 4 is comprised of M number of fiber amplifiers which amplify the above mentioned plurality of laser lights respectively for each laser light, and emitting them. Here a fiber amplifier for performing light amplification amplifies the energy of the laser light by converting the energy of the pump light into the energy of the laser light flowing through the optical fiber. A waveguide amplifier may be used instead of a fiber amplifier.

The first optical multiplexer 6 approximately coaxially superimposes a plurality of laser lights $P_{11}, P_{12}, \ldots, P_{1m}$ emitted from the first fiber amplifier section 4, and emits the first fundamental wave 101 which is a pulse string. The second optical multiplexer 7 approximately coaxially superimposes a plurality of laser lights $P_{21}, P_{22}, \ldots P_{2m}$ emitted from the second fiber amplifier section 5, and emits the second fundamental wave 102 which is a pulse string. Details of the mechanism of the first optical multiplexer 6 and the second optical multiplexer 7 will be described later.

The wavelength conversion optical system 8 is comprised of a first wavelength conversion device 9 for generating an A-harmonic wave of which frequency corresponds to A times the first fundamental wave 101, a second wavelength conversion device 10 for generating a B-harmonic wave of which frequency corresponds to B times the second fundamental wave, and a third wavelength conversion device 11 for acquiring (A+B)-fold harmonics using sum frequency generation by synchronously receiving the A-harmonic wave and B-harmonic wave. Out of the first fundamental wave 101 and second fundamental wave 102, the frequencies $\omega_{1m}'$ and $\omega_{2m}'$, after the laser lights having the m-th frequency transmitted through the first and second wavelength conversion devices 4, 5, are given by the following Expressions (3) and (4).

$$\omega_{1m}' = [\omega_0 + (m-1) \cdot a \cdot \Delta\omega] \cdot A \quad (3)$$

$$\omega_{2m}' = [\omega_0 + (m-1) \cdot b \cdot \Delta\omega] \cdot B \quad (4)$$

where m=1, 2, ..., M

As FIG. 1 shows, the laser lights emitted from each laser light source constituting the first laser light source section 2 and second laser light source section 3 are pulse lights. These laser lights emitted from each laser light source can be a continuous light (CW light), but the conversion efficiency of the wavelength conversion devices 9 to 11 of the laser light source device 1 may possibly drop. The laser lights (pulse lights) having the m-th frequency emitted from the first and second laser light source section 2 and 3 are constructed so as to synchronously enter the third wavelength conversion device 11 (e.g. later mentioned wavelength conversion crystal 35) at the same time.

Now the first or second optical multiplexer 6, 7 (hereafter called "optical multiplexer 6, 7) will be described using FIG. 2. The optical multiplexer 6, 7 to be described here coaxially superimposes laser lights using a diffraction optical element or a dispersion prism.

The diffraction grating 71 has the nature that the emitting angle when the laser light, which enters the diffraction optical face Gf and is diffracted, emits, is determined by the diffraction angle of the diffraction optical face Gf (pitch of the diffraction grating), and frequency (wavelength) and incident angle of the laser light that enters. As mentioned above, the frequency of the laser lights emitted from each laser light source constituting the first or second laser light source section 2, 3 are different by a predetermined difference amount ($(m-1) \cdot a \cdot \Delta\omega$ or $(m-1) \cdot b \cdot \Delta\omega$) as Expressions (1) and (2) show. Therefore if the frequency of the laser lights emitted from the first or second fiber amplifier section 4, 5, incident angle to the diffraction grating 71, and diffraction angle of the diffraction optical face Gf are matched, then the laser lights can be coaxially superimposed and emitted with the same emitting angle for all the laser lights diffracted by the diffraction optical face Gf.

Figure 2:
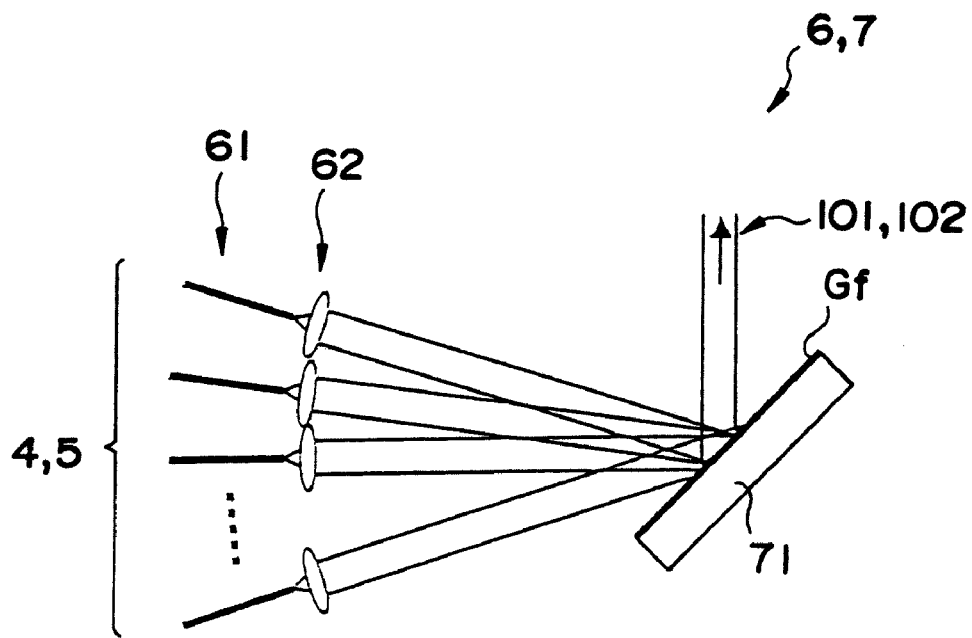
FIG. 2 is a diagram depicting the first configuration example of the optical multiplexer.

Therefore as FIG. 2 shows, the optical multiplexer 6, 7 sets the emission angle with respect to the diffraction grating 71 of the emission section 61 of the fiber amplifier constituting the first or second fiber amplifier section 4,5 according to the frequency and the diffraction angle of the diffraction optical face Gf, converts the laser lights emitted from the emission section 61 of the respective fiber amplifier into parallel lights using the respective collimator lenses 62, and enters the parallel lights into a same section of the diffraction grating 71 (diffraction optical face Gf). The laser lights which entered the diffraction optical face Gf are diffracted and coaxially superimposed at predetermined emission angles according to the incident angle and frequency, and emits them as the first or second fundamental wave 101, 102, as mentioned above.

The diffraction grating 71 constituting the optical multiplexer 6, 7 uses only one diffraction, so a blazed grating which can implement high diffraction efficiency only with a specific diffracted lights is preferable. Any order can be used for the diffraction grating 71, but the diffraction efficiency can be generally increased as the order becomes lower. The interval of the collimator lenses can be increased as the order increases, because the angle of the lights emitted from the emission section 61 of the fiber amplifier with respect to the diffraction optical face Gf can be increased. The collimator lenses 62 are preferably installed at positions with which the lights from the emission sections 61 are converted into parallel lights, but even when the lights are not perfectly converted into parallel lights, it is acceptable only if the laser lights from all the emission sections 61 constituting the first or second fiber amplifier section 4, 5 has the same beam diameter and spread angle at a point on the optical axis of the diffraction optical face Gf.

Figure 3:
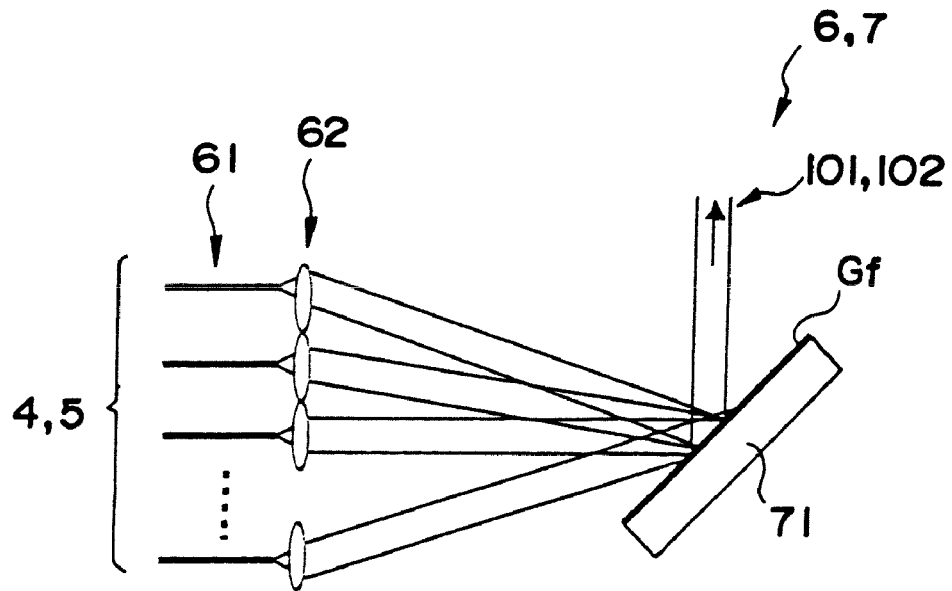
FIG. 3 is a diagram depicting the second configuration example of the optical multiplexer.

The optical multiplexer 6, 7 is not limited to the above configuration, and other configuration examples will be described with reference to FIG. 3 to FIG. 6. (The above described optical multiplexer 6, 7 is called the first configuration example). FIG. 3 is a second configuration example of the optical multiplexer 6, 7. In the second configuration example, the emission sections 61 from the first or second fiber amplifier section 4, 5 are arranged to be approximately parallel, the collimator lenses 62 are set to be vertical to the optical axis, and by parallel-shifting the collimator lenses 62 in the incident plane direction, the laser lights are condensed to one point on the grating optical face Gf of the diffraction grating 71. In the second configuration example, the emission sections 61 of the fiber amplifier, which are arranged roughly in parallel, can be easily structured because a V groove can be used for the position adjustment of the emission sections 61.

Figure 4:
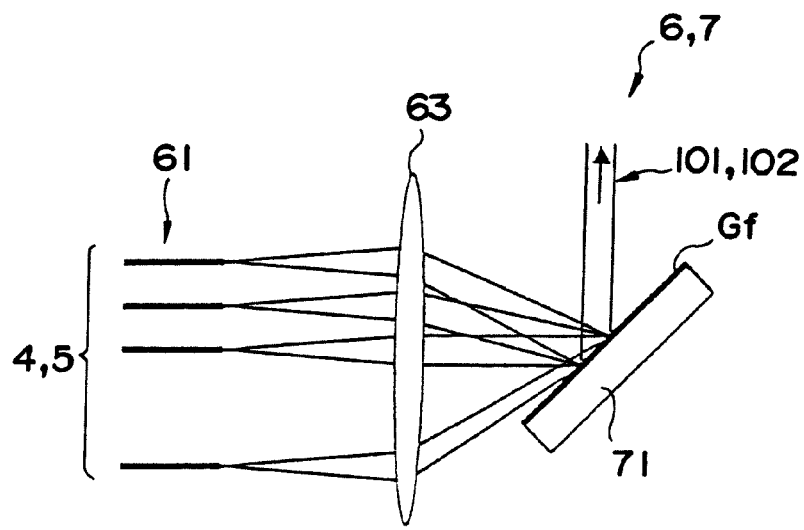
FIG. 4 is a diagram depicting the third configuration example of the optical multiplexer.

FIG. 4 shows the third configuration example of the optical multiplexer 6, 7. In the first and second configuration examples, a collimator lens 62 is installed for each of the emission sections 61 of the fiber amplifier, but in the third configuration example, one collimator lens 63 is installed, and the laser lights emitted from each emitting section 61 are condensed into one point on the diffraction optical face Gf of the diffraction grating 71. This collimator lens 63 is preferably installed at a location distant from the emitting sections 61 of the fiber amplifier for the amount of the focal distance of the lens.

Figure 5:
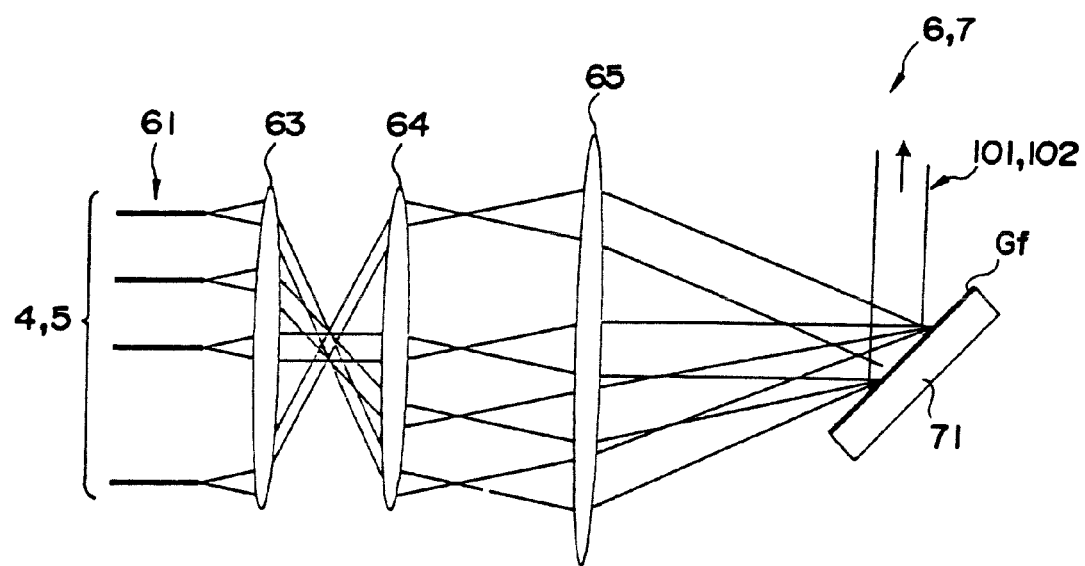
FIG. 5 is a diagram depicting the fourth configuration example of the optical multiplexer.

FIG. 5 shows the fourth configuration example of the optical multiplexer 6, 7. In the fourth configuration example, two lenses 64 and 65 are installed after the collimator lens 63 in the third configuration example, so that the laser lights emitted from the emission sections 61 are condensed to one point on the diffraction optical face Gf of the diffraction grating 71 by the collimator lens 63 and two lenses 64 and 65. By these two lenses 64 and 65, the focal distances of the lenses 63 to 64 can be changed, and by changing the relative angles of the output ends (emitting sections 61) of the laser lights that enter the diffraction grating 71, the incident angles of the laser lights that enter the diffraction optical face Gf can be adjusted according to the design of the diffraction grating 71.

Figure 6:
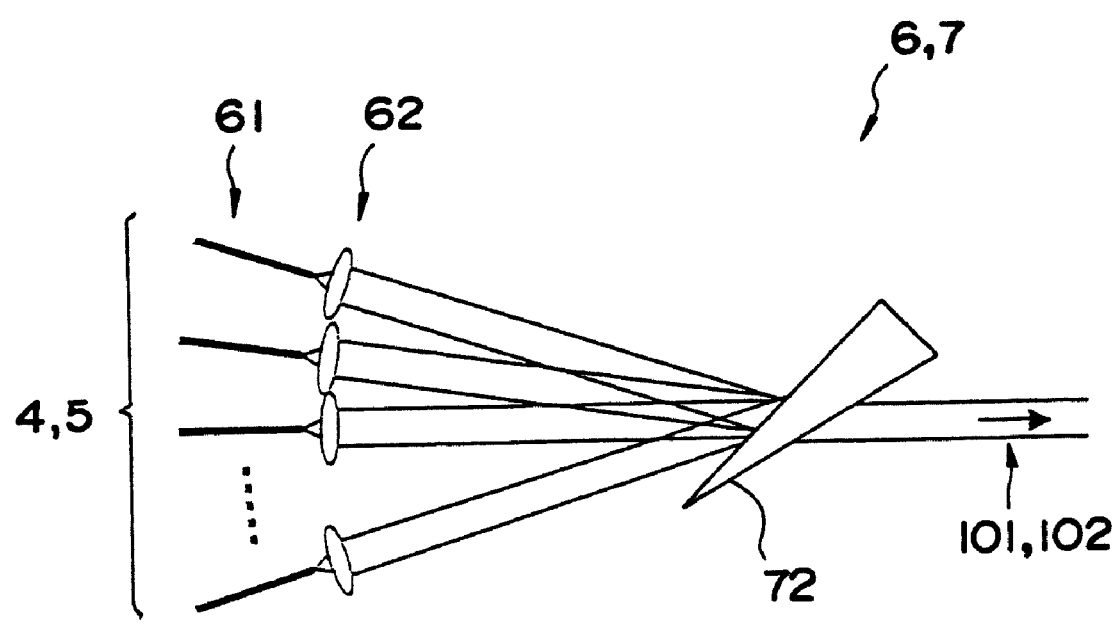
FIG. 6 is a diagram depicting the fifth configuration example of the optical multiplexer.

FIG. 6 shows the fifth configuration example of the optical multiplexer 6, 7. In the above described first to fourth configuration examples, the diffraction grating 71 is used, but in the fifth configuration example, the dispersion prism 72 is used. In other words, the emission sections 61 of the fiber amplifier are set so as to form a predetermined incident angel with respect to the dispersion prism 72, and the laser lights emitted from these emission sections 61 are converted into parallel lights using collimator lenses 62 which are installed corresponding to the respective emission section 61, then enter one point on the dispersion prism 72. The laser lights transmitted through the dispersion prism 72 are approximately coaxially superimposed and emitted as the first or second fundamental wave 101, 102.

As described above, a plurality of laser lights (output from the fiber amplifier), of which frequencies are slightly different from each other, can be approximately coaxially superimposed and emitted efficiently by the optical multiplexer 6, 7 having a simple configuration using the diffraction grating 71 or dispersion prism 72. The above described first to fifth configuration examples of the optical multiplexer 6, 7 are the cases of using the diffraction grating 71 or dispersion prism 72, but an interference filter or a wave guide may be used.

The first and second fundamental waves 101, 102 which are approximately coaxially superimposed pulse strings in the first and second optical multiplexers 6, 7 are translated to harmonic wave in the first and second wavelength conversion devices 9, 10, and are approximately coaxially superimposed by a dichroic mirror or a filter which is not illustrated in FIG. 1, and enter the third wavelength conversion device 11.

The third wavelength conversion device 11 is for generating laser light having a frequency that is the sum of two laser lights simultaneously entered, and uses sum frequency generation, which is a phenomenon based on a non-linear optical effect. Therefore the laser light transmitted through the third wavelength conversion device 11 has a frequency that is (A+B) times the fundamental frequency $\omega_0$, and this relationship satisfies the following Expression (5).

$$\omega_{1m}' + \omega_{2m}' = (A+B) \cdot \omega_0 \quad (5)$$

where m=1, 2, ..., M

In order for the laser light, emitted from the laser light source for emitting the laser light having the m-th frequency, out of a plurality of laser light sources constituting the first or second laser light source 2,3, to be converted into a laser light having a frequency that is (A+B) times the fundamental frequency $\omega_0$ in the third wavelength conversion device 11 with the shift from the fundamental frequency $\omega_0$ cancelled, the following Expression (6) must be satisfied because of the relationships in Expressions (3) to (5).

$$A \cdot a + B \cdot b = 0 \quad (6)$$

As described above, it is necessary that the output (pulse lights) from the laser light source which emits laser light having the m-th frequency, out of a plurality of laser light sources constituting each of the first and second laser light source sections 2, 3, are synchronously output and simultaneously enter the third wavelength conversion optical device 11, but the outputs of the laser light sources (1, 2, ..., m-th laser light source) constituting the first or second laser light source section 2, 3 may be either simultaneously or shifted in time. (FIG. 1 shows the case when all the outputs are shifted in time). This is the same as the examples described below, where the laser lights (pulse lights) from the m-th laser light source constituting the first and second laser light source sections 2, 3 are synchronously emitted. In this example, the intervals of M number of light wavelengths emitted from each laser light source are constant, but this is not necessarily constant if the respective m-th lights satisfy Expression (6).

Also, in this example, the first and second fundamental waves are multiplied by A and B in the first and second wavelength conversion devices 9, 10, then an (A+B)-harmonic wave is generated by the third wavelength conversion device 11 using sum frequency generation, but a laser light having a sum frequency of the first and second fundamental waves using sum frequency generation, without multiplying the first and second fundamental waves by A and B may be used.

Now based on the above basic configurations, two examples of a laser light source device 1 (21, 41), which converts the laser lights emitted from the semiconductor laser with a 1547 nm wavelength into an eighth-harmonic wave and emits 193 nm laser light, will be described.

The fundamental frequency $\omega_0$ corresponds to 1/plus integer of the frequency of the final output light (1/N times, N is a plus integer).

EXAMPLE 1

Figure 7:
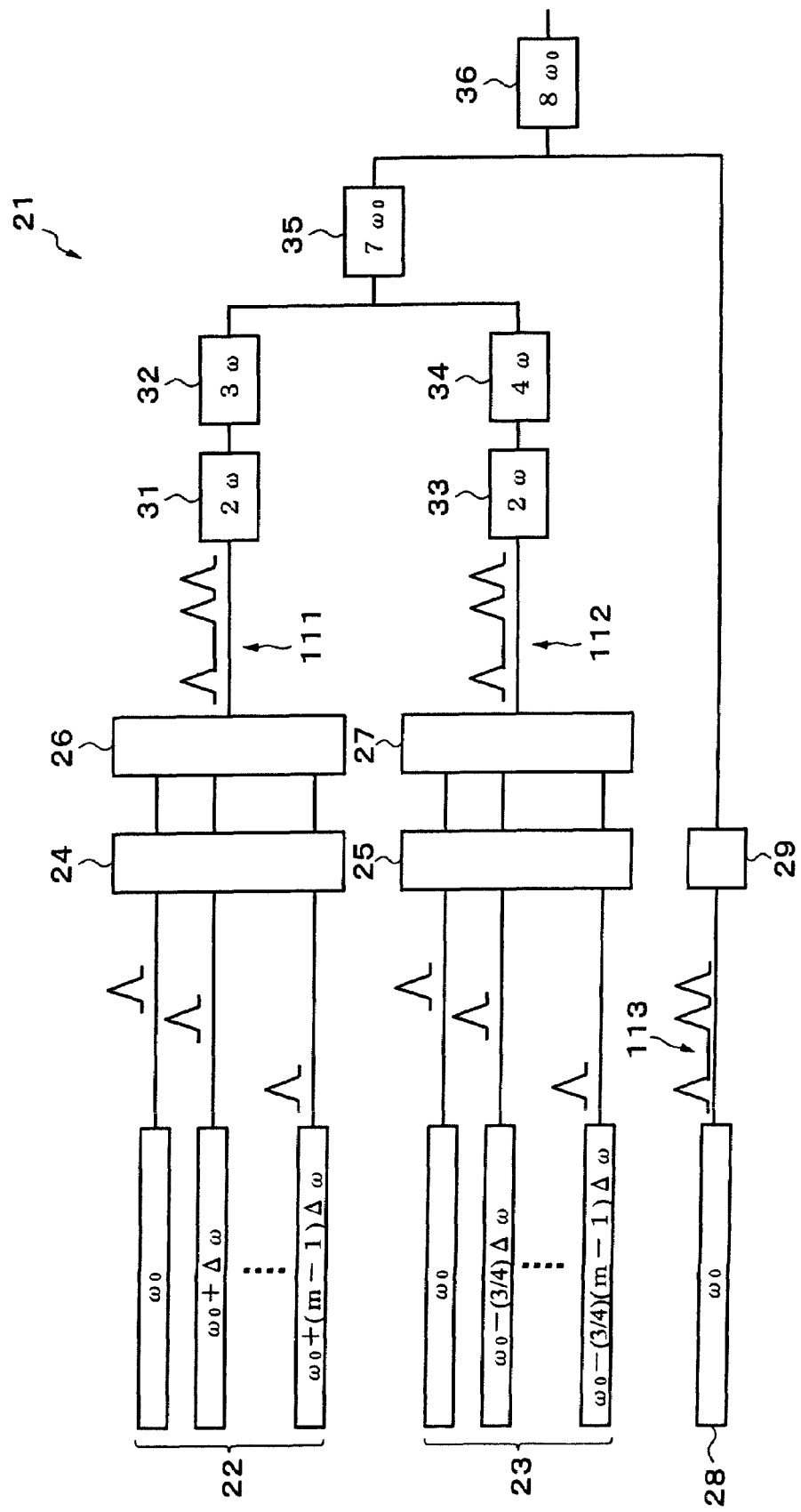
FIG. 7 is a block diagram depicting the first example of the laser light source device according to the present invention.

FIG. 7 shows the first example of the laser light source device which emits an eighth-harmonic wave. This laser light source device 21 is comprised of a first laser light source section 22, second laser light source section 23, third laser light source section 28, first fiber amplifier section 24, second fiber amplifier section 25, third fiber amplifier section 29, first optical multiplexer 26, second optical multiplexer 27, and first to sixth wavelength conversion crystals 31 to 36.

The first laser light source section 22 is comprised of m number of laser light sources, and when the frequency of the laser light emitted from the first laser light source is $\omega_0$, the frequency of the laser light emitted from the m-th laser light source is set to be a frequency which is different from frequency $\omega_0$ by $\omega_0+(m-1)\cdot\Delta\omega$. The first fiber amplifier section 24 is comprised of m number of fiber amplifiers which amplify each laser light emitted from the m number of laser light sources respectively. The m number of laser lights emitted from the first fiber amplifier section 24 enter the first optical multiplexer 26, and are approximately coaxially superimposed and emitted as the first fundamental wave (pulse string) 111, as mentioned above. This first fundamental wave 111 has m number of frequency components shown in the following Expression (7).

$$[\omega_0, \omega_0+\Delta\omega, \ldots, \omega_0+(m-1)\cdot\Delta\omega] \quad (7)$$

The first fundamental wave 111 emitted from the first optical multiplexer 26 enters the first wavelength conversion crystal 31, and the light of a part of the laser lights are converted into second-harmonic waves. For the first wavelength conversion crystal 31 used for this purpose, PPLN (Periodically Poled LiNbO$_3$), PPLT (Periodically Poled LiTaO$_3$), PPKTP (Periodically Poled KTiOPO$_4$), LBO (LiB$_3$O$_5$) or BBO ($\beta$-BaB$_2$O$_4$), for example, can be used. The second-harmonic wave emitted from the first wavelength conversion crystal 31 is a pulse string having m number of the frequency components shown in Expression (8).

$$[2\omega_0, 2(\omega_0+\Delta\omega), \ldots, 2(\omega_0+(m-1)\cdot\Delta\omega)] \quad (8)$$

The second-harmonic wave emitted from the first wavelength conversion crystal 31 and transmitted fundamental waves enter the second wavelength conversion crystal 32, and the light of a part thereof are converted into third-harmonic waves. For the second wavelength conversion crystal 32, PPLN, PPLT, PPKTP, LBO or BBO, for example, can be used. The third-harmonic wave of the first fundamental wave 111 emitted from the second wavelength conversion crystal 32 is a pulse string having m number of the frequency components shown in Expression (9).

$$[3\omega_0, 3(\omega_0+\Delta\omega), \ldots, 3(\omega_0+(m-1)\cdot\Delta\omega)] \quad (9)$$

The second laser light source section 23 is comprised of m number of laser light sources, and when the frequency of the laser light emitted from the first laser light source is $\omega_0$, the frequency of the laser light emitted from the m-th laser light source is set to be different from the frequency $\omega_0$ by $\omega-(\tfrac{3}{4})\cdot(m-1)\cdot\Delta\omega$. The second fiber amplifier section 25 is comprised of m number of fiber amplifiers which amplify each laser light emitted from the m number of laser light sources respectively. The m number of laser lights emitted from the second fiber amplifiers section 25 enter the second optical multiplexer 27, and are appropriately coaxially superimposed and emitted as the second fundamental wave (pulse string) 112, as mentioned above. This second fundamental wave 112 has m number of frequency components shown in Expression (10).

$$[\omega_0, \omega_0-(\tfrac{3}{4})\cdot\Delta\omega, \ldots, \omega_0-(m-1)\cdot(\tfrac{3}{4})\cdot\Delta\omega] \quad (10)$$

The second fundamental wave 112 emitted from the second optical multiplexer 27 enters the third wavelength conversion crystal 33, and the light of a part of the laser lights are converted into second-harmonic waves. For the third wavelength conversion crystal 33, PPLN, PPLT, PPKTP, LBO or BBO, for example, can be used. The second-harmonic wave of the second fundamental wave 112 emitted from the third wavelength conversion crystal 33 is a pulse string having m number of frequency components shown in Expression (11).

$$[2\omega_0, 2(\omega_0-(\tfrac{3}{4})\cdot\Delta\omega), \ldots, 2(\omega_0-(m-1)\cdot(\tfrac{3}{4})\cdot\Delta\omega)] \quad (11)$$

The second-harmonic wave emitted from the third wavelength conversion crystal 33 enters the fourth wavelength conversion crystal 34, and the light of a part thereof are converted into fourth-harmonic waves. For the fourth wavelength conversion crystal 34, PPLN, PPLT, PPKTP, LBO or BBO, for example, can be used. The fourth-harmonic wave of the second fundamental wave 112 emitted from the fourth wavelength conversion crystal 34 is a pulse string having m number of frequency components shown in Expression (12).

$$[4\omega_0, 4(\omega_0-(\tfrac{3}{4})\cdot\Delta\omega), \ldots, 4(\omega_0-(m-1)\cdot(\tfrac{3}{4})\cdot\Delta\omega)] \quad (12)$$

The third-harmonic wave of the first fundamental wave 111 emitted from the second wavelength conversion crystal 32 and the fourth-harmonic wave of the second fundamental wave 112 emitted from the fourth wavelength conversion crystal 34 are approximately coaxially superimposed by a dichroic mirror or filter, which are not illustrated, then enter the fifth wavelength conversion crystal 35, and the light of a part of the third-harmonic waves and fourth-harmonic waves are converted into seventh-harmonic waves using sum frequency generation, as mentioned above. For the fifth wavelength conversion crystal 35, BBO or KBBF (KBe$_2$BO$_3$F$_2$), for example, can be used. For the seventh-harmonic wave of laser light emitted from the fifth wavelength conversion crystal 35, the lights from the m-th laser light source constituting the first laser light source section 22 and the second laser light source section 23 are converted into third-harmonic waves and fourth-harmonic waves respectively, then simultaneously enter the fifth wavelength conversion crystal 35, and since the relationship of Expression (6) is satisfied, all the frequency components become a pulse string having a frequency seven times the fundamental frequency $\omega_0$, as shown in Expression (13).

$$[7\omega_0, 7\omega_0, \ldots, 7\omega_0] \quad (13)$$

The seventh-harmonic wave laser lights (pulse string) emitted from the fifth wavelength conversion crystal 35 and third fundamental wave 113, which is a pulse string of the fundamental frequency $\omega_0$ emitted from the third laser light source section 28 (pulse string synchronizing the pulse lights emitted from the m number of laser light sources constituting the first or second laser light source section 22, 23), are amplified by the third fiber amplifier section 29, and these laser lights are approximately coaxially superimposed by a diachronic mirror or filter, which are not illustrated, then simultaneously enter the sixth wavelength conversion crystal 36, and the light of a part of the seventh-harmonic waves and the fundamental waves are converted into eighth-harmonic waves using sum frequency generation. For the sixth wavelength conversion crystal 36, BBO, LBO, CLBO or KBBF, for example, can be used. The pulse string of this eighth-harmonic wave also has a frequency eight times the fundamental frequency $\omega_0$, as shown in Expression (14). The eighth-harmonic wave is emitted from the laser light source device 21 according to the first example.

$$[8\omega_0, 8\omega_0, \ldots, 8\omega_0] \quad (14)$$

As described above, according to the laser light source device 21 of the first example, the frequencies of laser lights emitted from the respective laser light sources constituting the first and second laser light source sections 22, 23 are set to be slightly different, then the laser lights can be approximately coaxially superimposed efficiently by the incident angles of the laser lights and the diffraction grating 61 of the first or second optical multiplexer 26, 27 to generate a pulse string (first or second fundamental wave 111, 112). Also by setting the frequencies of the laser lights emitted from the first laser light source section 22 to acquire the third-harmonic waves and the second laser light source section 23 to acquire fourth-harmonic waves to satisfy Expression (6), seventh-harmonic waves can be acquired, and also desired eighth-harmonic waves can be acquired using seventh-harmonic waves. In the first example, laser lights amplified and emitted by a plurality of fiber amplifiers can be coaxially superimposed efficiently by the first and second optical multiplexers 26, 27, so conversion efficiency is generally high, and high power laser lights with a short wavelength (193 nm) can be output from the semiconductor laser with fundamental frequency (1547 nm).

In this first example, three laser light source sections (first to third laser light source sections 22, 23, 28) and corresponding three fiber amplifier sections (first to third fiber amplifier sections 26, 27, 29) are required, but an optical system can be simply constructed.

In this example, the intervals of M number of light wavelengths emitted from each laser light source are constant, but this is not necessarily constant if the respective m-th lights satisfy the relationship of Expression (15).

$$3 \cdot x_m + 4 \cdot (3/4) \cdot y_m = 0 \quad (15)$$

($x_1, x_2, \ldots x_M, y_1, y_2, \ldots y_M$ are arbitrary numbers that satisfy the expression.)

Also in this example, the frequencies of the laser lights emitted from the first laser light sources of the first laser light source section and second laser light source section are set to the fundamental frequency $\omega_0$, but the frequency of the laser light emitted from the first laser light source to be set may be frequently shifted from the fundamental frequency by a predetermined amount only if the relationship of (15) is satisfied.

EXAMPLE 2

Figure 8:
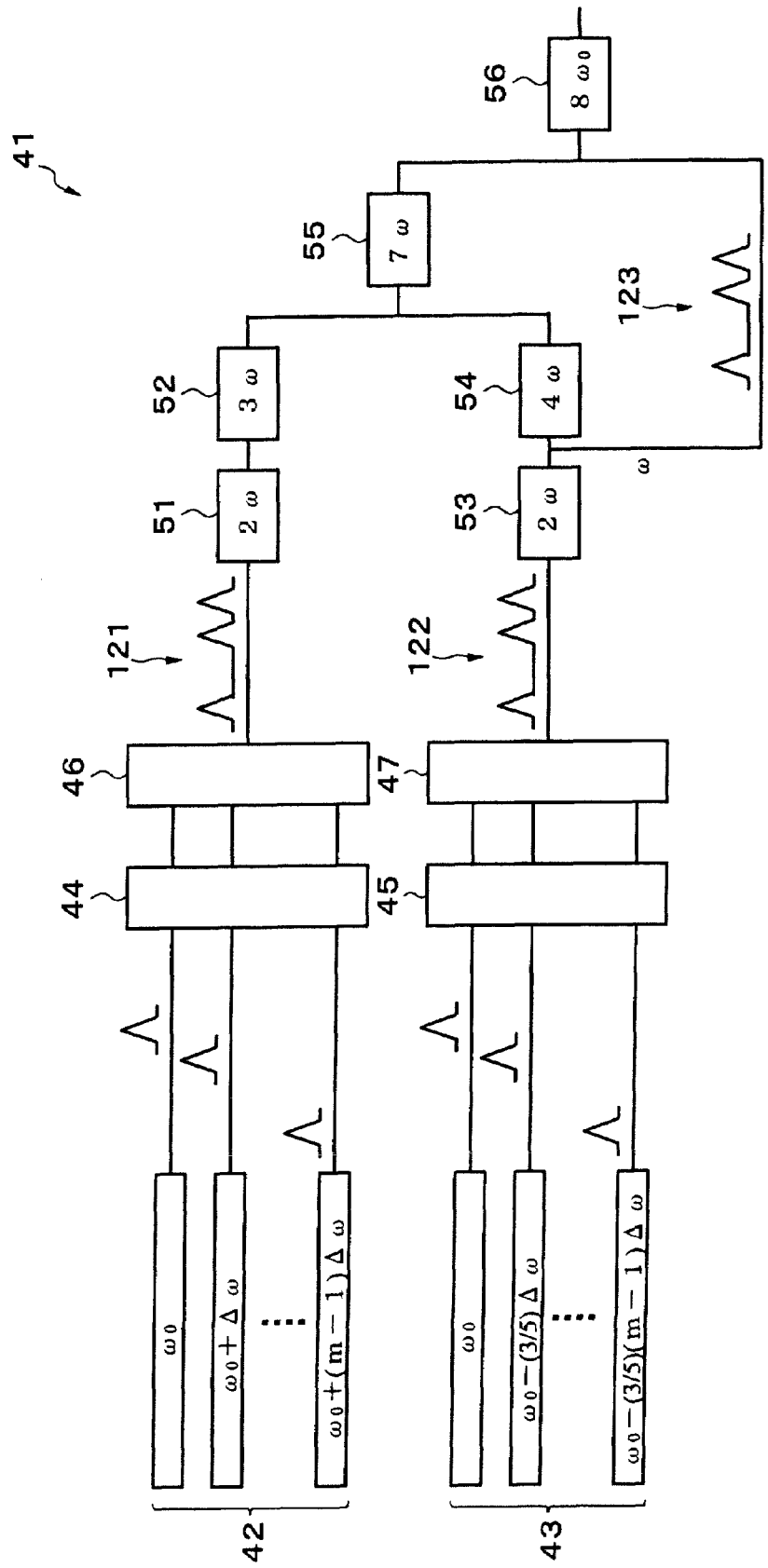
FIG. 8 is a block diagram depicting the second example of the laser light source device according to the present invention.

Now the second example of the laser light source device which emits an eighth-harmonic wave of the fundamental frequency will be described using FIG. 8. This laser light source device 41 is comprised of a first laser light source section 42, second laser light source section 43, first fiber amplifier section 44, second fiber amplifier section 45, first optical multiplexer 46, second optical multiplexer 47 and first to sixth wavelength conversion crystals 51 to 56.

The first laser light source section 42 is comprised of m number of laser light sources, and when the frequency of the laser light emitted from the first laser light source is $\omega_0$, the frequency of the laser light emitted from the m-th laser light source is set to be a frequency which is different from the frequency $\omega_0$ by $\omega_0+(m-1)\cdot\Delta\omega$. The first fiber amplifier section 44 is comprised of m number of fiber amplifiers, which amplify each laser light emitted from the m number of laser light sources respectively. The m number of laser lights emitted from the first fiber amplifier section 44 enters the first optical multiplexer 46, and are appropriately coaxially superimposed and emitted as the first fundamental wave (pulse string) 121. This first fundamental wave 121 has m number of frequency components shown in Expression (16).

$$[\omega_0, \omega_0+\Delta\omega, \ldots, \omega_0+(m-1)\cdot\Delta\omega] \quad (16)$$

And the first fundamental wave 121 emitted from the first optical multiplexer 46 enters the first wavelength conversion crystal 51, and the light of a part of laser lights are converted into second-harmonic waves. For the first wavelength conversion crystal 51 used for this purpose, PPLN, PPLT, PPKTP, LBO or BBO, for example, can be used. The second-harmonic wave of the first fundamental wave 121 emitted from the first wavelength conversion crystal 51 is a pulse string having m number of frequency components shown in Expression (17).

$$[2\omega_0, 2(\omega_0+\Delta\omega), \ldots, 2(\omega_0+(m-1)\cdot\Delta\omega)] \quad (17)$$

The second-harmonic wave emitted from the first wavelength conversion crystal 51 and the transmitted fundamental waves enter the second wavelength conversion crystal 52, and the light of a part thereof are converted into third-harmonic waves. For the second wavelength conversion crystal 52, PPLN, PPLT, PPKTP, LBO or BBO, for example, can be used. The third-harmonic wave of the first fundamental wave 121 emitted from the second wavelength conversion crystal 52 is a pulse string having m number of frequency components shown in Expression (18).

$$[3\omega_0, 3(\omega_0+\Delta\omega), \ldots, 3(\omega_0+(m-1)\cdot\Delta\omega)] \quad (18)$$

The second laser light source section 43 is comprised of m number of laser light sources and when the frequency of the laser light emitted from the first laser light source is $\omega_0$, the frequency of the laser light emitted from the m-th laser light source is set to be different from the frequency $\omega_0$ by $\omega_0-(m-1)\cdot(3/5)\cdot\Delta\omega$. The second fiber amplifier section 45 is comprised of m number of fiber amplifiers which amplify each laser light emitted from the m number of laser light sources respectively. The m number of laser lights emitted from the second fiber amplifier section 45 enter the second optical multiplexer 47, and are approximately coaxially superimposed and emitted as the second fundamental wave (pulse string) 122. The second fundamental wave 122 has m number of frequency components shown in Expression (19).

$$[\omega_0, \omega_0-(3/5)\Delta\omega, \ldots, \omega_0-(m-1)\cdot(3/5)\cdot\Delta\omega] \quad (19)$$

The second fundamental wave 122 emitted from the second optical multiplexer 47 enters the third wavelength conversion crystal 53, and the light of a part of the laser lights are converted into second-harmonic waves. For the third wavelength conversion crystal 53, PPLN, PPLT, PPKTP, LBO or BBO, for example, can be used. The second-harmonic wave of the second fundamental wave 122 emitted from the third wavelength conversion crystal 53 is a pulse string having m number of frequency components shown in Expression (20).

$$[2\omega_0, 2(\omega_0-(3/5)\cdot\Delta\omega), \ldots, 2(\omega_0-(m-1)\cdot(3/5)\cdot\Delta\omega] \quad (20)$$

The laser lights emitted from the third wavelength conversion crystal 53 are the wavelength-converted second-harmonic wave and transmitted fundamental wave, but only the second-harmonic wave enters the fourth wavelength conversion crystal 54 by a dichroic mirror, for example, which is not illustrated. And the light of a part of the second-harmonic waves are converted into fourth-harmonic waves by the fourth wavelength conversion crystal 54. For the fourth wavelength conversion crystal 54, PPLN, PPLT, PPKTP, LBO or BBO, for example, can be used. The fourth-harmonic wave of the second fundamental wave 122 emitted from the fourth wavelength conversion crystal 54 is a pulse string having m number of frequency components shown in Expression (21).

$$[4\omega_0, 4(\omega_0-(3/5)\cdot\Delta\omega, \ldots, 4(\omega_0-(m-1)\cdot(3/5)\cdot\Delta\omega] \quad (21)$$

The third-harmonic wave of the first fundamental wave 121 emitted from the second wavelength conversion crystal 52 and fourth-harmonic wave of the second fundamental wave 122 emitted from the fourth wavelength conversion crystal 54 are appropriately coaxially superimposed by a dichroic mirror or filter, which are not illustrated, then enter the fifth wavelength conversion crystal 55, and the light of a part of the third-harmonic wave and fourth-harmonic waves are converted into seventh-harmonic waves using sum frequency generation, as mentioned above. For the second example as well, the lights from the m-th laser light sources constituting the first laser light source section 42 and second laser light source section 43 are converted into a third-harmonic wave and fourth-harmonic wave respectively, and then simultaneously enter the fifth wavelength conversion crystal 55, and satisfy the relationship of Expression (6). For the fifth wavelength conversion crystal 55, BBO or KBBF, for example, can be used. The seventh-harmonic wave of the laser light emitted from the fifth wavelength conversion crystal 55 becomes a pulse string having m number of frequency components shown in Expression (22).

$$[7\omega_0, 7\omega_0+(3/5)\cdot\Delta\omega, \ldots, 7\omega_0+(m-1)\cdot(3/5)\cdot\Delta\omega] \quad (22)$$

The seventh-harmonic wave laser light (pulse string) emitted from the fifth wavelength conversion crystal 55 and fundamental wave transmitted through the third wavelength conversion crystal 53 and separated by a dichroic mirror, which is not illustrated, are approximately coaxially superimposed by a dichroic mirror, which is not illustrated, then enter the sixth wavelength conversion crystal 56, and a part of the seventh-harmonic waves and fundamental waves are converted into eighthh-harmonic waves using sum frequency generation. The m-th pulse lights of the seventh-harmonic wave and fundamental wave simultaneously enter to the sixth wavelength conversion crystal 56 as well. For the sixth wavelength conversion crystal 56, BBO, LOB, CLBO or KBBF, for example, can be used. The pulse string of the eighth-harmonic wave has a frequency eight times the fundamental frequency $\omega_0$ as shown in Expression (23). The eighth-harmonic wave is emitted from the laser light source device 41 according to the second example.

$$[8\omega_0, 8\omega_0, \ldots, 8\omega_0] \quad (23)$$

As described above, according to the laser light source device 41 of the second example as well, the wavelength conversion efficiency of the laser lights can be high, just like the first example, and high power laser lights with a short wavelength (193 nm) can be output. In the case of the laser light source device 41 according to the second example, devices corresponding to the third laser light source section 28 and third fiber amplifier section 29 of the first example are unnecessary, so the device configuration is simple, but the fundamental wave transmitted through the third wavelength conversion crystal 53 must be separated, and an eighth-harmonic wave must be generated using this laser light, which makes the wavelength conversion optical system complicated.

In this example, intervals of M number of light wavelengths emitted from each laser light source are constant, but this is not necessarily constant if the respective m-th lights satisfy the relationship of Expression (24).

$$3 \times x_M + 4\cdot(3/5)\cdot y_m + 3/5\cdot y_m = 0 \quad (24)$$

($x_1, x_2, \ldots x_M, y_1, y_2, \ldots y_M$ are arbitrary numbers that satisfy the expression.)

Also in this example, the frequencies of the laser lights emitted from the first laser light sources of the first laser light source section and second laser light source section are set to the fundamental frequency $\omega_0$, but the frequency of the laser light emitted form the first laser light source to be set may be a frequency shifted from the fundamental frequency by a predetermined amount only if the relationship of (24) is satisfied.

EXAMPLE 3

Figure 9:
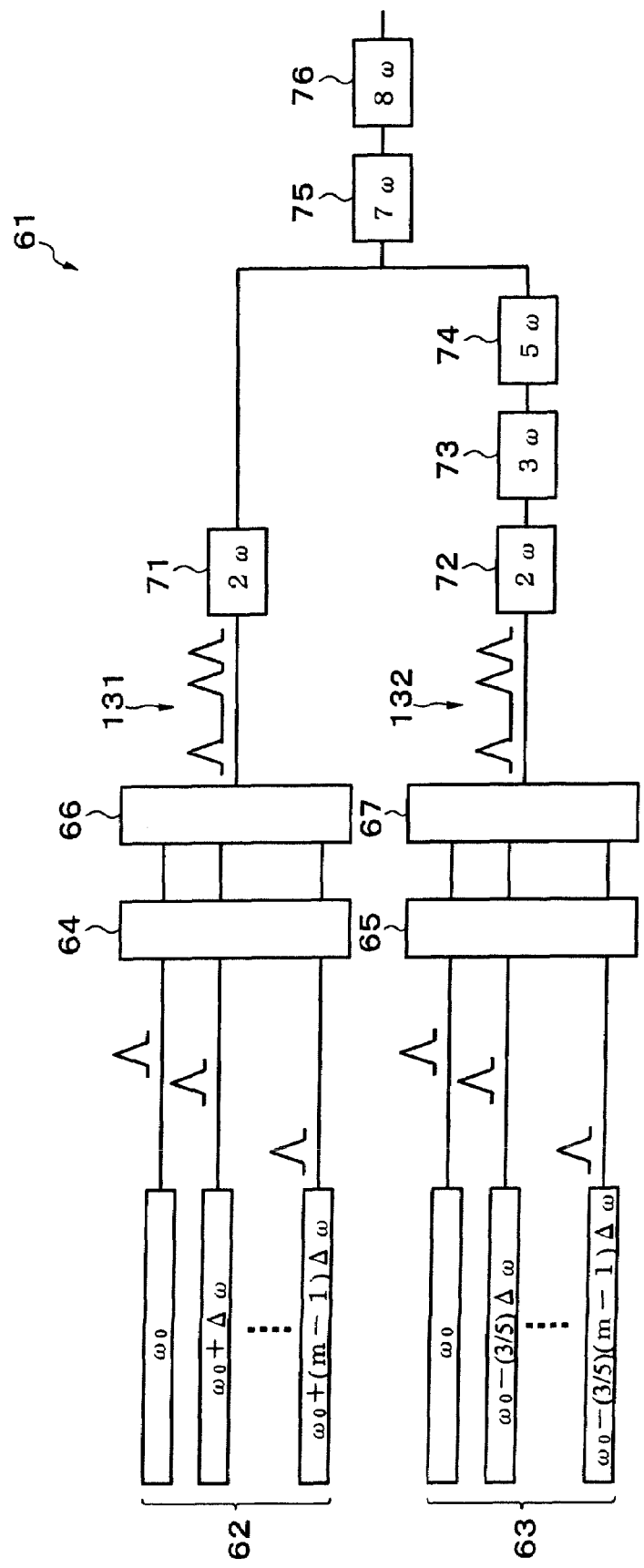
FIG. 9 is a block diagram depicting the third example of the laser light source device according to the present invention.

Now the third example of the laser light source device which emits an eighth-harmonic wave of the fundamental frequency will be described using FIG. 9. This laser light source deice 61 is comprised of a first laser light source section 62, second laser light source section 63, first fiber amplifier section 64, second fiber amplifier section 65, first optical multiplexer 66, second optical multiplexer 67 and first to sixth wavelength conversion crystals 71 to 76.

The first laser light source section 62 is comprised of m number of laser light sources, and when the frequency of the laser light emitted from the first laser light source is $\omega_0$, the frequency of the laser light emitted from the m-th laser light source is set to be a frequency which is different from the frequency $\omega_0$ by $\omega_0+(m-1)\cdot\Delta\omega$. The first fiber amplifier section 64 is comprised of m number of fiber amplifiers, which amplify each laser light emitted from the m number of laser light sources respectively. The m number of laser lights emitted from the first fiber amplifier 64 enter the first optical multiplexer 66, and are approximately coaxially superimposed and emitted as the first fundamental wave (pulse string) 131. This first fundamental wave 131 has m number of frequency components shown in Expression (25).

$$[\omega_0, \omega_0+\Delta\omega, \ldots, \omega_0+(m-1)\cdot\Delta\omega] \quad (25)$$

And the first fundamental wave 131 emitted from the first optical multiplexer 66 enters the first wavelength conversion crystal 71, and the light of a part of the laser lights are converted into second-harmonic waves. For the first wavelength conversion crystal 71 used for this purpose, PPLN, PPKTP, LBO, BBO, CBO or CLBO, for example, can be used. The two-field wave of the first fundamental wave 131 emitted from the first wavelength conversion crystal 71 is a pulse string having m number of frequency components shown in Expression (26).

$$[2\omega_0, 2(\omega_0 + \Delta\omega), \ldots, 2(\omega_0 + (m-1)\cdot\Delta\omega)] \quad (26)$$

The second laser light source section 63 is comprised of m number of laser light sources, and when the frequency of the laser light emitted from the first laser light source is $\omega_0$, the frequency of the laser light emitted from the m-th laser light source is set to be different from the frequency $\omega_0$ by $\omega_0 - (m-1)\cdot(3/5)\cdot\Delta\omega$. The second fiber amplifier section 65 is comprised of m number of fiber amplifiers which amplify each laser light emitted from the m number of laser light sources respectively. The m number of laser lights emitted from the second fiber amplifier section 65 enter the second optical multiplexer 67, and are approximately coaxially superimposed and emitted as the second fundamental wave (pulse string) 132. The second fundamental wave 132 has m number of frequency components shown in Expression (27).

$$[\omega_0, \omega_0 - (3/5)\Delta\omega, \ldots, \omega_0 - (m-1)\cdot(3/5)\cdot\Delta\omega] \quad (27)$$

The second fundamental wave 132 emitted from the second optical multiplexer 67 enters the second wavelength conversion crystal 72, and the light of a part of the laser lights are converted into second-harmonic waves. For the second wavelength conversion crystal 72, PPLN, PPLT, PPKTP, LBO or BBO, for example, can be used. The second-harmonic wave of the second fundamental wave 132 emitted from the second wavelength conversion crystal 72 is a pulse string having m number of frequency components shown in Expression (28).

$$[2\omega_0, 2(\omega_0 - (3/5)\cdot\Delta\omega), \ldots, 2(\omega_0 - (m-1)\cdot(3/5)\cdot\Delta\omega)] \quad (28)$$

The second-harmonic wave emitted from the second wavelength conversion crystal 72 and transmitted fundament wave enter the third wavelength conversion crystal 73, and the light of a part thereof are converted into third-harmonic waves. For the third wavelength conversion crystal 73, LBO or BBO, for example, can be used. The third-harmonic wave of the second fundamental wave 132 emitted from the third wavelength conversion crystal 73 is a pulse string having m number of frequency components shown in Expression (29).

$$[3\omega_0, 3(\omega_0 - (3/5)\cdot\Delta\omega), \ldots, 3(\omega_0 - (m-1)\cdot(3/5)\cdot\Delta\omega)] \quad (29)$$

The third-harmonic wave emitted from the third wavelength conversion crystal 73 and transmitted second-harmonic wave enters the fourth wavelength conversion crystal 74, and the light of a part thereof are converted into fifth-harmonic waves. For the fourth wavelength conversion crystal 74, BBO or CBO, for example, can be used. The fifth-harmonic wave of the second fundamental wave 132 emitted from the fourth wavelength conversion crystal 74 is a pulse string having m number of frequency components shown in Expression (30).

$$[5A\omega_0, 5(\omega_0 - (3/5)\cdot\Delta\omega), \ldots, 5(\omega_0 - (m-1)\cdot(3/5)\cdot\Delta\omega)] \quad (30)$$

The second-harmonic wave of the first fundamental wave 131 emitted from the first wavelength conversion crystal 71 and fifth-harmonic wave of the second fundamental wave 132 emitted from the fourth wavelength conversion crystal 74 are approximately coaxially superimposed by a dichroic mirror or filter, which are not illustrated, then enter the fifth wavelength conversion crystal 75, and the wavelength of a part of the second-harmonic waves and fifth-harmonic waves are converted into seventh-harmonic waves using sum frequency generation, as mentioned above. In the third example as well, the lights from the m-th laser light sources constituting the first laser light source section 62 and second laser light source section 63 are converted into a second-harmonic wave and fifth-harmonic wave respectively, then simultaneously enter the fifth wavelength conversion crystal 75. For the fifth wavelength conversion crystal 75, CLBO, for example, can be used. The seventh-harmonic wave of the laser light emitted from the fifth wavelength conversion crystal 55 becomes a pulse string having m number of frequency components shown in Expression (31).

$$[7\omega_0, 7\omega_0 - \Delta\omega, \ldots, 7\omega_0 - (m-1)\Delta\omega] \quad (31)$$

The seventh-harmonic wave (pulse string) emitted from the fifth wavelength conversion crystal 75 and the fundamental wave transmitted through the first wavelength conversion crystal 71 are approximately coaxially superimposed by a dichroic mirror (not shown), then the superimposed fundamental wave transmitted through the fifth wavelength conversion crystal 75 enters the sixth wavelength conversion crystal 76, and the light of a part thereof are converted into eighth-harmonic waves. The m-th pulse lights of the seventh-harmonic wave and fundamental wave simultaneously enter this sixth wavelength conversion crystal 76 as well. For the sixth wavelength conversion crystal 76, BBO, LBO, CLBO, KBBF, for example, can be used. The pulse string of the eighth-harmonic wave has a frequency eight times the fundamental frequency $\omega_0$, as shown in Expression (32). This eighth-harmonic wave is emitted from the laser light source device 61 according to the third example.

$$[8\omega_0, 8\omega_0, \ldots, 8\omega_0] \quad (32)$$

In this example, the intervals of M number of light wavelengths emitted from each laser light source are constant, but they are not necessarily constant if the respective m-th lights satisfy the relationship of Expression (33).

$$2\cdot x_M + 5\cdot(3/5)\cdot_m + 1\cdot x_M = 0 \quad (33)$$

($x_1, x_2, \ldots x_M, y_1, y_2, \ldots, y_M$ are arbitrary numbers that satisfy the expression.)

Also in this example, the frequencies of the laser lights emitted from the first laser light source of the first laser light source section and second laser light source section are set to the fundamental frequency $\omega_0$, but the frequency of the laser light emitted from the first laser light source to be set may be a frequency shifted from the fundamental frequency by a predetermined amount only if the relationship of (33) is satisfied.

Also in the present invention, the fundamental frequency of the first laser light source section and fundamental frequency of the second laser light source section are set to be the same, but different frequencies may be set only if the relationship of (33) is satisfied.

As described above, by the laser light source device 61 according to the third example as well, the wavelength conversion efficiency of the laser light can be high, and high power laser lights with a short wavelength (193 nm) can be output, just like the first example. In the case of the laser light source device 61 according to the third example, the devices corresponding to the third laser light source section 28 and third fiber amplifier section 29 in the first example are unnecessary, so the device configuration becomes simple.

In examples 1 to 3, the fundamental frequency of the first laser light source section and fundamental frequency of the second laser light source section are set to be the same, but different fundamental frequencies may be set.

EXAMPLE 4

Now an exposure device 200 and a mask inspection device 300 for generating and using laser lights with a short wavelength (e.g. laser lights with 193 nm) using the above mentioned laser light source device 1 (21, 41, 61) will be described as the fourth example.

Figure 10:
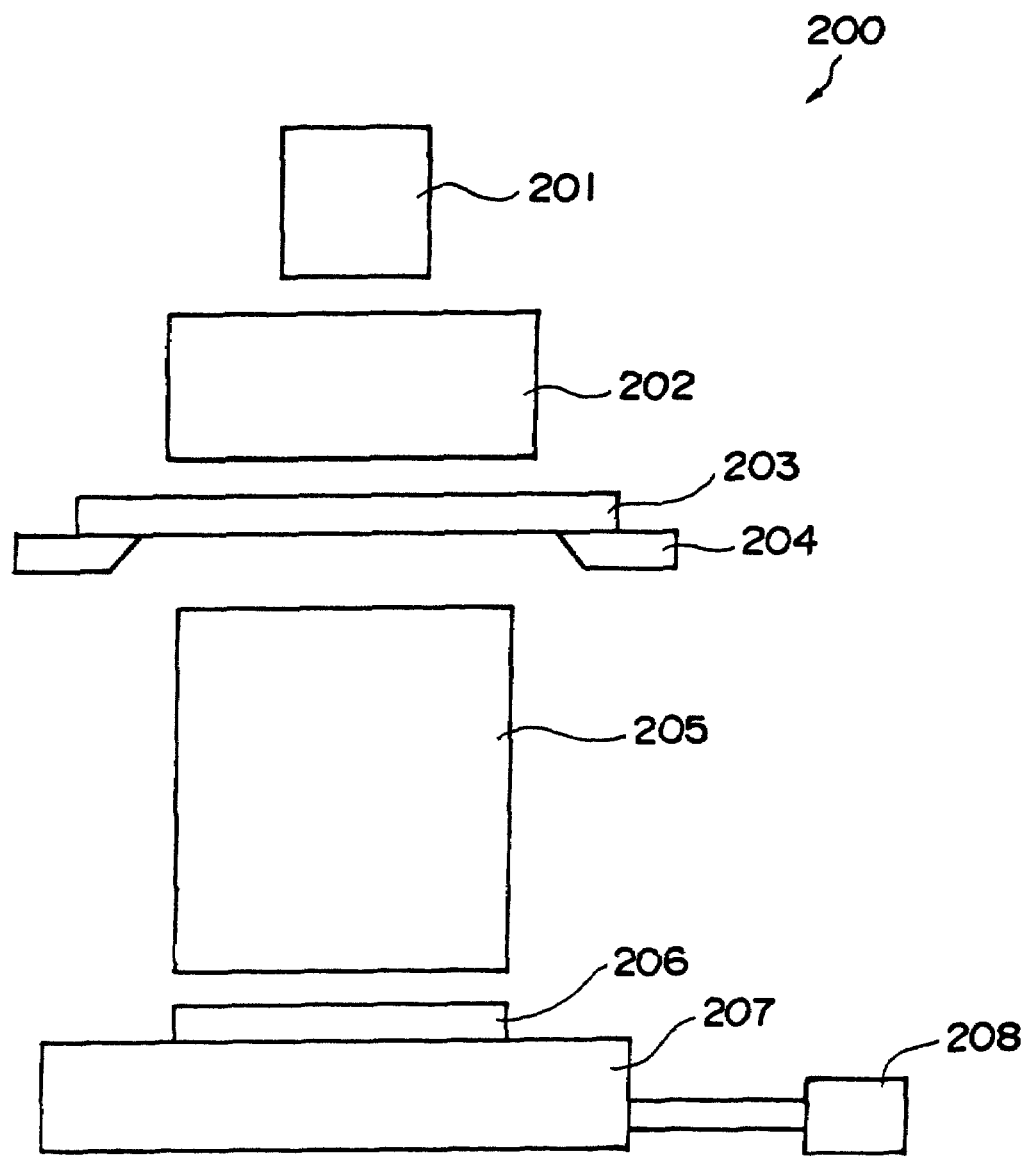
FIG. 10 is a diagram depicting the exposure device according to the present invention.

First the exposure device 200 will be described using FIG. 10. The exposure device 200 used for the photolithography process is theoretically the same as photo-engraving, and a device pattern accurately written on a photo-mask (reticle) is optically projected and transferred on a semiconductor wafer or glass substrate, on which photo-resist is coated. The above mentioned laser light source device (first example 21, second example 41 or third example 61) 201 is integrated with the exposure device, including the illumination optical system 202 and projection optical system 205. In this case, the laser light source device 201 may be secured on a frame supporting the illumination optical system 202, or the laser light source device 201 may be independently secured on a frame. It is preferable, however, that the power supply to be connected to the laser light source device 201 is independently installed.

And the laser light emitted from the laser light source device 201 is enlarged and projected by the illumination optical system 202 so that the illumination distribution on the required projection face becomes uniform, and is projected on the quartz mask (quartz reticle) 203 on which the circuit patterns of the integrated circuit are actually written. The circuit patterns of the reticle 203, reduced at a predetermined reduction ratio, are projected on a semiconductor wafer (e.g. silicon wafer) 206, on which photo-resist is coated, by the projection optical system 205, and an image of the above mentioned circuit patterns are formed and transferred onto the wafer 206.

The illumination optical system 202 is installed on an approximately common plane as the pattern face of the reticle 203, and includes a field stop for specifying the illumination area on the reticle 203, an aperture stop for specifying the light quantity distribution of the laser light on a predetermined plane which forms an approximately Fourier transform relationship with the pattern face of the reticle 203 in the illumination optical system 202, and a condenser lens for irradiating the laser light emitted from the aperture stop onto the reticle 203. In this case, a plurality of aperture stops of which at least one of the shapes and sizes are different are installed in the turret, and one of the plurality of aperture stops selected according to the pattern of the reticle 203 may be placed on an optical path of the illumination optical system 202, so as to change the light quantity distribution of the laser light on the predetermined plane.

Also an optical integrator (homogenizer) may be installed between the wavelength conversion optical system of the laser light source device 201 and the field stop, so that if a fly eye lens is used, the focal point face at the emission side thereof forms an approximately Fourier transform relationship with the pattern face of the reticle 203, and if a rod integrator is used, the emission face thereof comes approximately common with the pattern face of the reticle 203.

As an exposure start shutter of the exposure device 200, an electro-optical modulation element or an acoustic-optical modulation element can be used. Exposure is started by switching the electro-optical modulation element or acoustic-optical modulation element from OFF status, that is the status of not generating pulses (internal loss is high), to ON status, that is the status of generating pulses (internal loss becomes less in pulse form).

The semiconductor wafer 206 is placed on the stage 207 having a drive mechanism 208, and the circuit pattern is transferred on a different position of the semiconductor wafer 206 by moving the stage 207 each time one exposure completes. This method of driving the stage and performing exposure is called a "step and repeat method". Another method of driving the stage 207 and performing exposure is a step and repeat method in which a drive mechanism is installed also in the support element 204 for supporting the reticle 203, so that the reticle 203 and semiconductor wafer 206 are simultaneously moved for scanning and exposure, and this method can also be applied for the exposure device 200.

Figure 11:
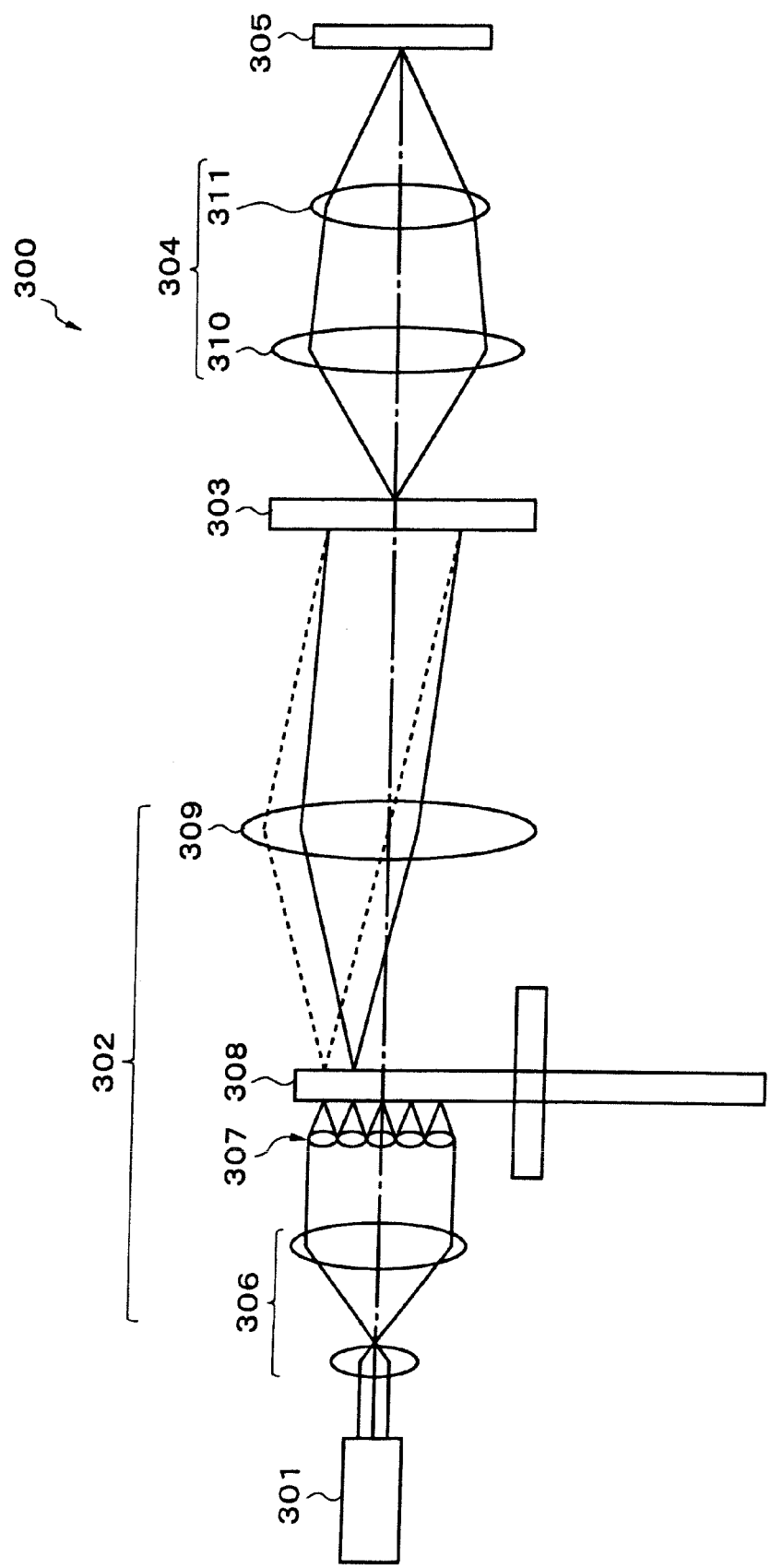
FIG. 11 is a diagram depicting the mask inspection device according to the present invention.

Now the mask inspection device 300 will be described using FIG. 11. As the miniaturization of semiconductor devices progresses, and as mentioned above a 193 nm laser light is currently used, defect inspection of a phase shift mask is also becoming important. A phase shift mask is a mask of resolving micro-patterns using a light interference effect, by shifting the transmission position of glass and light shielding section by 180° (e.g. above mentioned reticle 203). For this phase shift mask, a half tone mask, of which light shielding section is semi-transparent film, is often used, but unlike a conventional chrome mask, the transmittance and phase of the film are determined for the half tone mask so as to implement high contrast at an exposure wavelength. Therefore in order to detect a signal of a micro-pinhole defect on a mask, it is effective to make the wavelength of the inspection light source to be the same as the exposure wavelength, and the above mentioned laser light source device 21, 41 can be used for this inspection light source.

Now the combination of the mask inspection device 300 will be described. The mask inspection device 300 is comprised of an inspection light source (laser light source device) 301 for irradiating laser light, to which the above mentioned laser light source device 21, 41, 61 is applied, an illumination optical system 302 for irradiating laser light emitted from the laser light source device 301 to the mask 303, an image formation optical system 304 for forming images by condensing laser lights transmitted through the mask 303, and a TDI (Time Delay and Integration) sensor 305 for detecting an image formed by the image formation optical system 304.

In the illumination optical system 302, an expander lens 306, fly eye lens 307, rotational phase plate 308 and condenser lens 309 are installed in this sequence from the laser light source device 301 side. The laser light emitted from the laser light source device 301 is enlarged by the expander lens 306, and is divided into N×N (N: natural number) by the fly eye lens 307, and irradiated onto the rotational phase plate 308. This rotational phase plate 308 is a glass processed into a disk, and is installed perpendicular to the optical axis of the mask inspection device 300 so as to obstruct this optical axis, and is constructed to rotate with the center of the disk as the axis. On the entire surface of this disk, many small pits with different depths are formed. These pits are formed in the glass so that the phase of the transmitting light is shifted by 90°, 180° and 270°. Therefore the phases of the laser lights divided by the fly eye lens 307 can be changed at random by letting the lights transmit through the pits by rotating the rotational phase plate 308. The laser lights transmitted through the rotational phase plate 308 are condensed by the condenser lens 309, and irradiated onto the mask 303 as illumination light.

The illumination light transmitted through the mask 303 forms an image on the image capturing face of the TDI sensor 305 in the image formation optical system comprising an objective lens 310 and an image formation lens 311 installed sequentially from the mask 303 side. As mentioned above, the phase of illumination light irradiated onto the mask 303 is shifted at random by rotating the rotational phase plate 308, so the unevenness of the illumination intensity, due to interference, can be decreased by averaging the illumination lights by the storage type TDI sensor 305, and a clear image of the mask 303 can be acquired, and an image of micro-pinhole defects on the mask 303 can also be captured.

As described above, by using the laser light source device 1 (21, 41, 61) described in this example, high power laser lights with a short wavelength can be output, so an exposure device 200 and mask inspection device 300 for high integration of semiconductor devices can be implemented.

What is claimed is:

1. An exposure device, comprising:
    a laser light source device;
    an illumination optical system for irradiating laser lights emitted from the laser light source device on a reticle; and
    a projection optical system for condensing the laser lights transmitted through the reticle on a semiconductor wafer and forming an image of the reticle, and
    the laser light source device comprising,
    a first laser light source section comprising M number of laser light sources, where the m-th laser light source emits a laser light having a frequency shifted from a first fundamental frequency by $a_m \cdot \Delta\omega$ (m=1, 2, ..., M);
    a second laser light source section comprising M number of laser light sources, where the m-th laser light source emits a laser light having a frequency shifted from a second fundamental frequency by $b_m \cdot \Delta\omega$ (m=1, 2, ..., M);
    a first optical multiplexer for emitting a first fundamental wave by approximately coaxially superimposing M number of laser lights emitted from the first laser light source section;
    a second optical multiplexer for emitting a second fundamental wave by approximately coaxially superimposing M number of laser lights emitted from the second laser light source section; and
    a wavelength conversion optical system, comprising a first wavelength conversion device for generating an A-harmonic wave, of which frequency corresponds to A times of the first fundamental wave, a second wavelength conversion device for generating a B-harmonic wave, of which frequency corresponds to B times of the second fundamental wave, and a third wavelength conversion device for receiving light of the A-harmonic wave and the B-harmonic wave, and generating a sum frequency thereof by sum frequency generation,
    the laser light source device being characterized in that Expression $A \cdot a_m + B \cdot b_m = 0$ ($a_1, a_2, \ldots a_M$ and $b_1, b_2, \ldots, b_M$ are arbitrary numbers that satisfy the expression) is satisfied.

2. The exposure device according to claim 1, further comprising:
    a first light amplifier section having M number of light amplifiers each of which amplifies each laser light generated from M number of laser light sources in the first laser light source section; and
    a second light amplifier section having M number of light amplifiers each of which amplifies each laser light generated from M number of laser light sources in the second laser light source section.

3. The exposure device according to claim 1, characterized in that the first optical multiplexer or the second optical multiplexer comprises a diffraction grating or dispersion prism for receiving the laser light emitted from the first laser light source section or the second laser light source section at an incident angle which is set according to the shift amount from the fundamental frequency, and approximately coaxially superimposing the laser lights, which are diffracted or refracted, and emitting the laser lights.

4. An exposure device, comprising:
    a laser light source device;
    an illumination optical system for irradiating laser lights emitted from the laser light source device on a reticle; and
    a projection optical system for condensing the laser lights transmitted through the reticle on a semiconductor wafer and forming an image of the reticle, and
    the laser light source device comprising,
    a first laser light source section comprising M number of laser light sources, where the m-th laser light source emits a laser light having a frequency shifted from a fundamental frequency by $a_m \cdot \Delta\omega$ (m=1, 2, ..., M);
    a second laser light source section comprising M number of laser light sources, where the m-th laser light source emits a laser light having a frequency shifted from the fundamental frequency by $b_m \cdot \Delta\omega$ (m=1, 2, ..., M);
    a first optical multiplexer for emitting a first fundamental wave by approximately coaxially superimposing M number of laser lights emitted from the first laser light source section;
    a second optical multiplexer for emitting a second fundamental wave by approximately coaxially superimposing M number of laser lights emitted from the second laser light source section; and
    a wavelength conversion optical system, comprising a first wavelength conversion device for generating a third-harmonic wave, of which frequency corresponds to triple the first fundamental wave, a second wavelength conversion device for generating a fourth-harmonic wave, of which frequency corresponds to four times the second fundamental wave, and a third wavelength conversion device for receiving the third-harmonic wave and the fourth-harmonic wave, and generating a seventh-harmonic wave of which frequency is seven times the fundamental frequency by sum frequency generation,
    the laser light source device being characterized in that expression $3 \cdot a_m + 4 \cdot b_m = 0$ ($a_1, a_2, \ldots, a_M$ and $b_1, b_2, \ldots, b_M$ are arbitrary numbers that satisfy the expression) is satisfied.

5. The exposure device according to claim 4, further comprising a third laser light source section for emitting laser light having the fundamental frequency, and a fourth wavelength conversion device for receiving the seventh-harmonic wave and the laser light emitted from the third light source and generating an eighth-harmonic wave of which frequency is eight times the fundamental wave by sum frequency generation.

6. An exposure device, comprising:
    a laser light source device;
    an illumination optical system for irradiating laser lights emitted from the laser light source device on a reticle; and
    a projection optical system for condensing the laser lights transmitted through the reticle on a semiconductor wafer and forming an image of the reticle, and
    the laser light source device comprising,
    a first laser light source section comprising M number of laser light sources, where the m-th laser light source emits a laser light having a frequency shifted from a fundamental frequency by $a_m \cdot \Delta\omega$ (m=1, 2, ..., M);

a second laser light source section comprising M number of laser light sources, where the m-th laser light source emits a laser light having a frequency shifted from the fundamental frequency by $b_m \cdot \Delta\omega$ (m=1, 2, ..., M);

a first optical multiplexer for emitting a first fundamental wave by approximately coaxially superimposing M number of laser lights emitted from the first laser light source section;

a second optical multiplexer for emitting a second fundamental wave by approximately coaxially superimposing M number of laser lights emitted from the second laser light source section; and a wave length conversion optical system, comprising a first wavelength conversion device for generating a third-harmonic wave, of which frequency corresponds to triple the first fundamental wave, a second wave length conversion device for generating a fourth-harmonic wave, of which frequency corresponds to four times the second fundamental wave, a third wavelength conversion device for receiving the third-harmonic wave and the fourth-harmonic wave and generating a seventh-harmonic wave of which frequency is shifted from a frequency that is seven times the fundamental frequency by $b_m \cdot \Delta\omega$ (m=1, 2, ..., M) by sum frequency generation, and a fourth wavelength conversion device for receiving a part of the second fundamental wave and the seventh-harmonic wave and generating an eighth-harmonic wave of which frequency is eight times the fundamental frequency by sum frequency generation, the laser light source device being characterized in that expression $3 \cdot a_m + 5 \cdot b_m = 0$ ($a_1, a_2, \ldots, a_M$ and $b_1, b_2, \ldots, b_M$ are arbitrary numbers that satisfy the expression) is satisfied.

7. An exposure device, comprising:

a laser light source device;

an illumination optical system for irradiating laser lights emitted from the laser light source device on a reticle; and a projection optical system for condensing the laser lights transmitted through the reticle on a semiconductor wafer and forming an image of the reticle, and the laser light source device comprising, a first laser light source section comprising M number of laser light sources, where the m-th laser light source emits a laser light having a frequency shifted form a fundamental frequency by $a_m \cdot \Delta\omega$ (m=1, 2, ..., M);

a second laser light source section comprising M number of laser light sources, where the m-th laser light source emits a laser light having a frequency shifted from the fundamental frequency by $b_m \cdot \Delta\omega$ (m=1, 2, ..., M);

a first optical multiplexer for emitting a first fundamental wave by approximately coaxially superimposing M number of laser lights emitted from the first laser light source section;

a second optical multiplexer for emitting a second fundamental wave by appropriately coaxially superimposing M number of laser lights emitted from the second laser light source section; and a wavelength conversion optical system, comprising a first wavelength conversion device for generating a second-harmonic wave, of which frequency corresponds to double the first fundamental wave, a second wavelength conversion device for generating a fifth-harmonic wave, of which frequency corresponds to five times the second fundamental wave, a third wavelength conversion device for receiving the second-harmonic wave and the fifth-harmonic wave and generating a seventh-harmonic wave of which frequency is seven times the fundamental frequency by sum frequency generation, and a fourth wavelength conversion device for receiving the seventh-harmonic wave and the first fundamental wave transmitted through the first wavelength conversion device and third wavelength conversion device, and generating an eighth-harmonic wave of which frequency is eight times the fundamental frequency by sum frequency generation, the laser light source device being characterized in that the expression $3 \cdot a_m + 5 \cdot b_m = 0$ ($a_1, a_2, \ldots, a_M$ and $b_1, b_2, \ldots, b_M$ are arbitrary numbers that satisfy the expression) is satisfied.

8. A mask inspection device, comprising:

a laser light source device;

a phase conversion device for converting a phase of the laser light emitted from the laser light source device;

an illumination optical system for condensing the laser lights of which phases are converted by the phase conversion device and irradiating the condensed lights on a mask;

an image formation optical system for condensing the laser lights transmitted through the mask; and a sensor for detecting the laser light of which image is formed by the image formation optical system, and the laser light source device comprising, a first laser light source section comprising M number of laser light sources, where the m-th laser light source emits a laser light having a frequency shifted from a first fundamental frequency by $a_m \cdot \Delta\omega$ (m=1, 2, ..., M);

a second laser light source section comprising M number of laser light sources, where the m-th laser light source emits a laser light having a frequency shifted from a second fundamental frequency by $b_m \cdot \Delta\omega$ (m=1, 2, ..., M);

a first optical multiplexer for emitting a first fundamental wave by approximately coaxially superimposing M number of laser lights emitted from the first laser light source section;

a second optical multiplexer for emitting a second fundamental wave by approximately coaxially superimposing M number of laser lights emitted from the second laser light source section; and a wavelength conversion optical system, comprising a first wavelength conversion device for generating an A-harmonic wave, of which frequency corresponds to A times of the first fundamental wave, a second wavelength conversion device for generating a B-harmonic wave, of which frequency corresponds to B times of the second fundamental wave, and a third wavelength conversion device for receiving light of the A-harmonic wave and the B-harmonic wave, and generating a sum frequency thereof by sum frequency generation, the laser light source device being characterized in that Expression $A \cdot a_m + B \cdot b_m = 0$ ($a_1, a_2, \ldots a_M$ and $b_1, b_2, \ldots, b_M$ are arbitrary numbers that satisfy the expression) is satisfied.

9. The mask inspection device according to claim 8, further comprising:

a first light amplifier section having M number of light amplifiers each of which amplifies each laser light generated from M number of laser light sources in the first laser light source section; and a second light amplifier section having M number of light amplifiers each of which amplifies each laser light generated from M number of laser light sources in the second laser light source section.

10. The mask inspection device according to claim 8, characterized in that the first optical multiplexer or the second optical multiplexer comprises a diffraction grating or dispersion prism for receiving the laser light emitted from the first laser light source section or the second laser light source section at an incident angle which is set according to the shift amount from the fundamental frequency, and approximately coaxially superimposing the laser lights, which are diffracted or refracted, and emitting the laser lights.

11. A mask inspection device, comprising:
a laser light source device;
a phase conversion device for converting a phase of the laser light emitted from the laser light source device;
an illumination optical system for condensing the laser lights of which phases are converted by the phase conversion device and irradiating the condensed lights on a mask;
an image formation optical system for condensing the laser lights transmitted through the mask; and
a sensor for detecting the laser light of which image is formed by the image formation optical system, and
the laser light source device comprising,
a first laser light source section comprising M number of laser light sources, where the m-th laser light source emits a laser light having a frequency shifted from a fundamental frequency by $a_m \cdot \Delta\omega$ (m=1, 2, . . . , M);
a second laser light source section comprising M number of laser light sources, where the m-th laser light source emits a laser light having a frequency shifted from the fundamental frequency by $b_m \cdot \Delta\omega$ (m=1, 2, . . . , M);
a first optical multiplexer for emitting a first fundamental wave by approximately coaxially superimposing M number of laser lights emitted from the first laser light source section;
a second optical multiplexer for emitting a second fundamental wave by approximately coaxially superimposing M number of laser lights emitted from the second laser light source section; and
a wavelength conversion optical system, comprising a first wavelength conversion device for generating a third-harmonic wave, of which frequency corresponds to triple the first fundamental wave, a second wavelength conversion device for generating a fourth-harmonic wave, of which frequency corresponds to four times the second fundamental wave, and a third wavelength conversion device for receiving the third-harmonic wave and the fourth-harmonic wave, and generating a seventh-harmonic wave of which frequency is seven times the fundamental frequency by sum frequency generation,
the laser light source device being characterized in that expression $3 \cdot a_m + 4 \cdot b_m = 0$ ($a_1, a_2, \ldots, a_M$ and $b_1, b_2, \ldots, b_M$ are arbitrary numbers that satisfy the expression) is satisfied.

12. The mask inspection device according to claim 11, further comprising a third laser light source section for emitting laser light having the fundamental frequency, and a fourth wavelength conversion device for receiving the seventh-harmonic wave and the laser light emitted from the third light source and generating an eighth-harmonic wave of which frequency is eight times the fundamental wave by sum frequency generation.

13. A mask inspection device, comprising:
a laser light source device;
a phase conversion device for converting a phase of the laser light emitted from the laser light source device;
an illumination optical system for condensing the laser lights of which phases are converted by the phase conversion device and irradiating the condensed lights on a mask;
an image formation optical system for condensing the laser lights transmitted through the mask; and
a sensor for detecting the laser light of which image is formed by the image formation optical system, and
the laser light source device comprising,
a first laser light source section comprising M number of laser light sources, where the m-th laser light source emits a laser light having a frequency shifted from a fundamental frequency by $a_m \cdot \Delta\omega$ (m=1, 2, . . . , M);
a second laser light source section comprising M number of laser light sources, where the m-th laser light source emits a laser light having a frequency shifted from the fundamental frequency by $b_m \cdot \Delta\omega$ (m=1, 2, . . . , M);
a first optical multiplexer for emitting a first fundamental wave by approximately coaxially superimposing M number of laser lights emitted from the first laser light source section;
a second optical multiplexer for emitting a second fundamental wave by approximately coaxially superimposing M number of laser lights emitted from the second laser light source section; and
a wave length conversion optical system, comprising a first wavelength conversion device for generating a third-harmonic wave, of which frequency corresponds to triple the first fundamental wave, a second wave length conversion device for generating a fourth-harmonic wave, of which frequency corresponds to four times the second fundamental wave, a third wavelength conversion device for receiving the third-harmonic wave and the fourth-harmonic wave and generating a seventh-harmonic wave of which frequency is shifted from a frequency that is seven times the fundamental frequency by $b_m \cdot \Delta\omega$ (m=1, 2, . . . , M) by sum frequency generation, and a fourth wavelength conversion device for receiving a part of the second fundamental wave and the seventh-harmonic wave and generating an eighth-harmonic wave of which frequency is eight times the fundamental frequency by sum frequency generation,
the laser light source device being characterized in that expression $3 \cdot a_m + 5 \cdot b_m = 0$ ($a_1, a_2, \ldots, a_M$ and $b_1, b_2, \ldots, b_M$ are arbitrary numbers that satisfy the expression) is satisfied.

14. A mask inspection device, comprising:
a laser light source device;
a phase conversion device for converting a phase of the laser light emitted from the laser light source device;
an illumination optical system for condensing the laser lights of which phases are converted by the phase conversion device and irradiating the condensed lights on a mask;
an image formation optical system for condensing the laser lights transmitted through the mask; and
a sensor for detecting the laser light of which image is formed by the image formation optical system, and
the laser light source device comprising,
a first laser light source section comprising M number of laser light sources, where the m-th laser light source emits a laser light having a frequency shifted form a fundamental frequency by $a_m \cdot \Delta\omega$ (m=1, 2, . . . , M);
a second laser light source section comprising M number of laser light sources, where the m-th laser light source emits a laser light having a frequency shifted from the fundamental frequency by $b_m \cdot \Delta\omega$ (m=1, 2, . . . , M);

a first optical multiplexer for emitting a first fundamental wave by approximately coaxially superimposing M number of laser lights emitted from the first laser light source section;

a second optical multiplexer for emitting a second fundamental wave by appropriately coaxially superimposing M number of laser lights emitted from the second laser light source section; and a wavelength conversion optical system, comprising a first wavelength conversion device for generating a second-harmonic wave, of which frequency corresponds to double the first fundamental wave, a second wavelength conversion device for generating a fifth-harmonic wave, of which frequency corresponds to five times the second fundamental wave, a third wavelength conversion device for receiving the second-harmonic wave and the fifth-harmonic wave and generating a seventh-harmonic wave of which frequency is seven times the fundamental frequency by sum frequency generation, and a fourth wavelength conversion device for receiving the seventh-harmonic wave and the first fundamental wave transmitted through the first wavelength conversion device and third wavelength conversion device, and generating an eighth-harmonic wave of which frequency is eight times the fundamental frequency by sum frequency generation, the laser light source device being characterized in that the expression $3 \cdot a_m + 5 \cdot b_m = 0$ ($a_1, a_2, \ldots, a_M$ and $b_1, b_2, \ldots, b_M$ are arbitrary numbers that satisfy the expression) is satisfied.

* * * * *